United States Patent [19]

Masumi

[11] Patent Number: 5,462,916
[45] Date of Patent: Oct. 31, 1995

[54] SUPERCONDUCTIVE OPTOELECTRONIC DEVICES WITH THE BASIC SUBSTANCE $Bi_2O_3$ OF SUPERCONDUCTIVE-CONJUGATE PHOTOCONDUCTIVITY

[75] Inventor: Taizo Masumi, Yokohama, Japan

[73] Assignee: The University of Tokyo, Tokyo, Japan

[21] Appl. No.: 195,833

[22] Filed: Feb. 14, 1994

Related U.S. Application Data

[63] Continuation of Ser. No. 739,373, Aug. 2, 1991, abandoned.

[30] Foreign Application Priority Data

Aug. 3, 1990 [JP] Japan .................................. 2-205264

[51] Int. Cl.$^6$ .......................... H01L 39/22; H01L 39/12; H01B 12/00
[52] U.S. Cl. ..................... 505/182; 505/702; 505/193; 257/35; 257/39; 257/462
[58] Field of Search .................... 257/35, 39, 462; 505/702.1, 702

[56] References Cited

U.S. PATENT DOCUMENTS 4,990,487  2/1991  Masumi ..................................... 357/5

FOREIGN PATENT DOCUMENTS 0332448  9/1989  European Pat. Off. .
0354812  2/1990  European Pat. Off. .

OTHER PUBLICATIONS

Journal of Applied Physics, vol. 59, No. 11, Jun. 1, 1986, New York, US, pp. 3807–3814; Y. Enomoto et al: 'Optical detector using superconducting $BaPb_{0.7}Bi_{03}O_3$ thin films'.
IEEE Journal of Quantum Electronics, vol. 25, No. 11, Nov. 1989, New York, US, pp. 2405–2409; W. Eidelloth et al: 'Optical Response of Bulk Bi–Sr–Ca–Cu–O'.

*Primary Examiner*—Sara W. Crane
*Attorney, Agent, or Firm*—Sughrue, Mion, Zinn, Macpeak & Seas

[57] ABSTRACT

The disclosed superconductive optoelectronic device with the basic substance $Bi_2O_3$ or $Bi_2O_3;M^{2+}$ (M=Ca,Sr,Cu) of superconductive-conjugate photoconductivity has a substrate, a photoconductive gate region formed on the substrate, and a source region and a drain region formed on the substrate at opposite sides of the gate region so as to face toward each other across the gate region. The source region and the drain region are made of a Bi-based superconductive material. The gate region is made of such the basic material $Bi_2O_3$ or $Bi_2O_3;M^{2+}$ (M=Ca,Sr,Cu) of superconductive-conjugate photoconductivity, which reveals photoconductivity at a temperature below the transition temperature of the above relevant Bi-based superconductive material. Also disclosed are superconductive optoelectronic devices formed of an organized integration of the above superconductive optoelectronic devices to develop effectively a new field of "Superconductive Optoelectronics".

7 Claims, 30 Drawing Sheets

FIG_1
"Basic Substances of Superconductive-Conjugate Photoconductivity"
Basic Substance
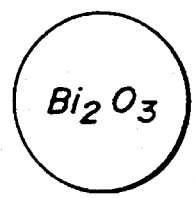
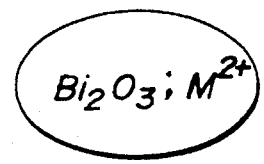
Host Insulators
(Superconductive-Conjugate Photoconductors)
⇓
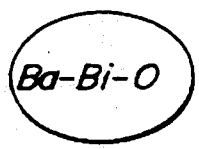
⇓
Superconductors
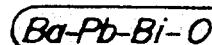
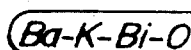
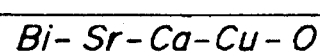

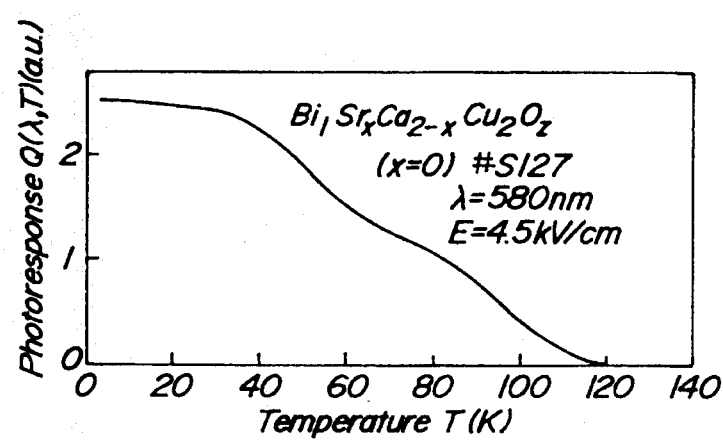
FIG_2c
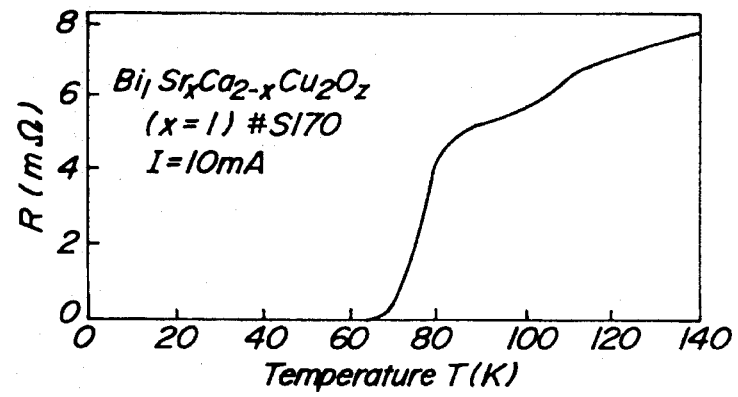
FIG_2d

FIG_3a
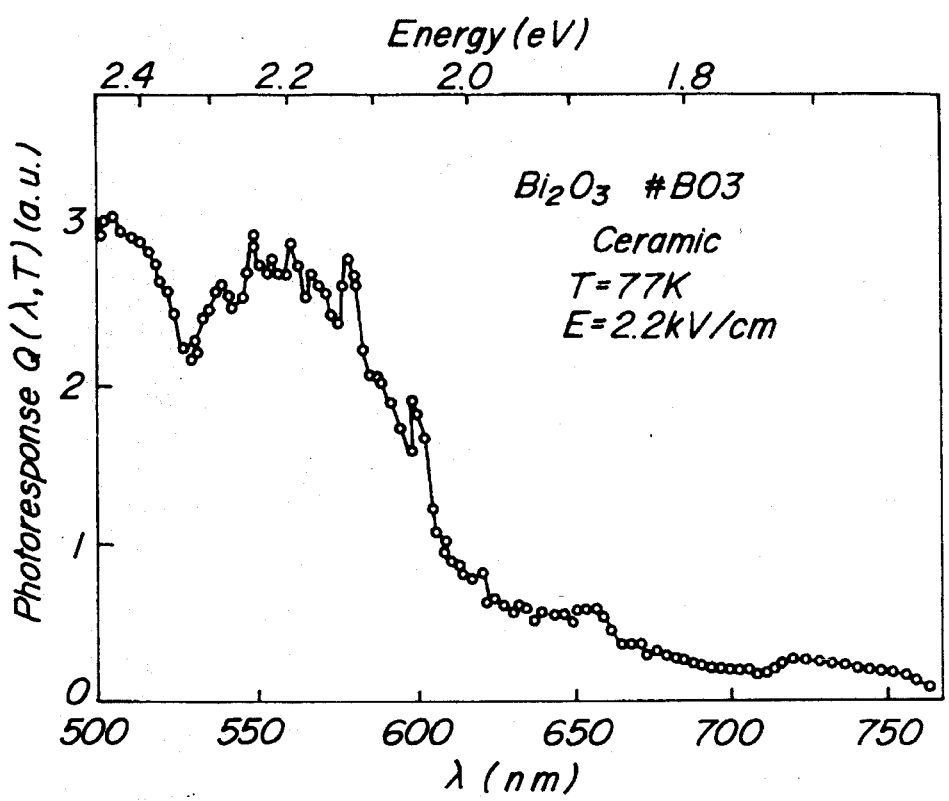
FIG_3b
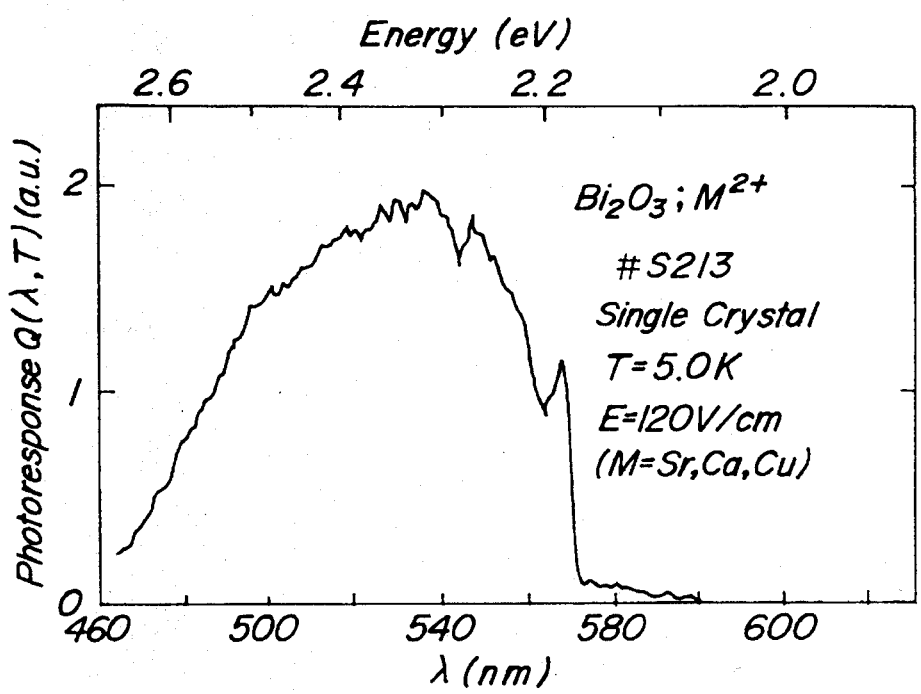

FIG_3c
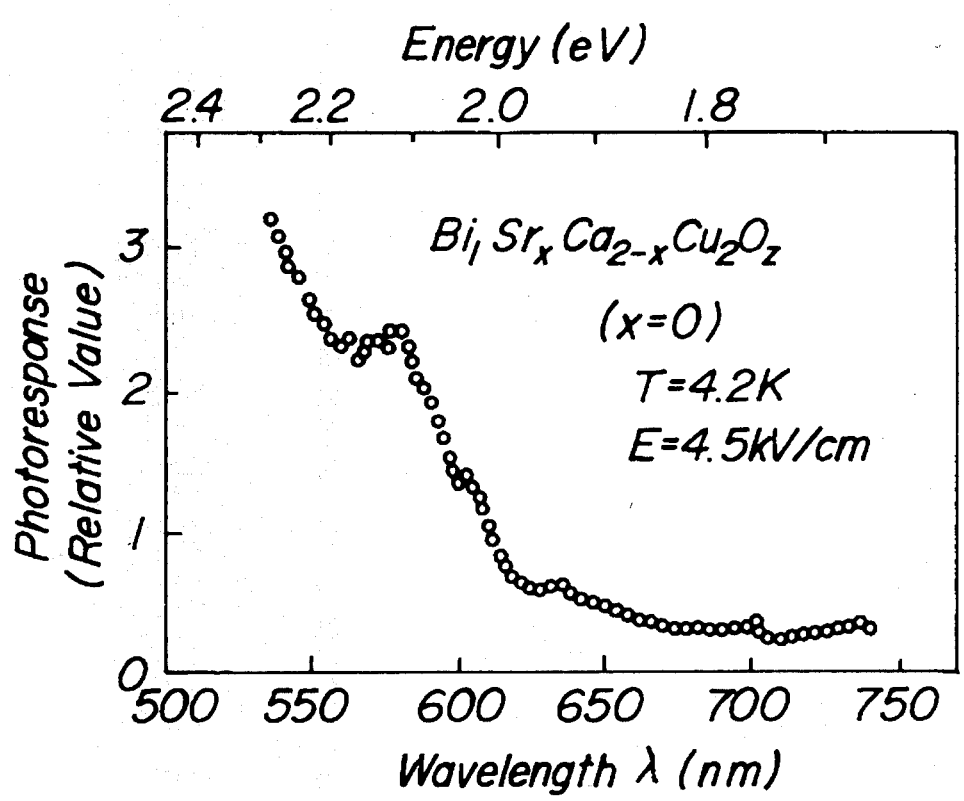

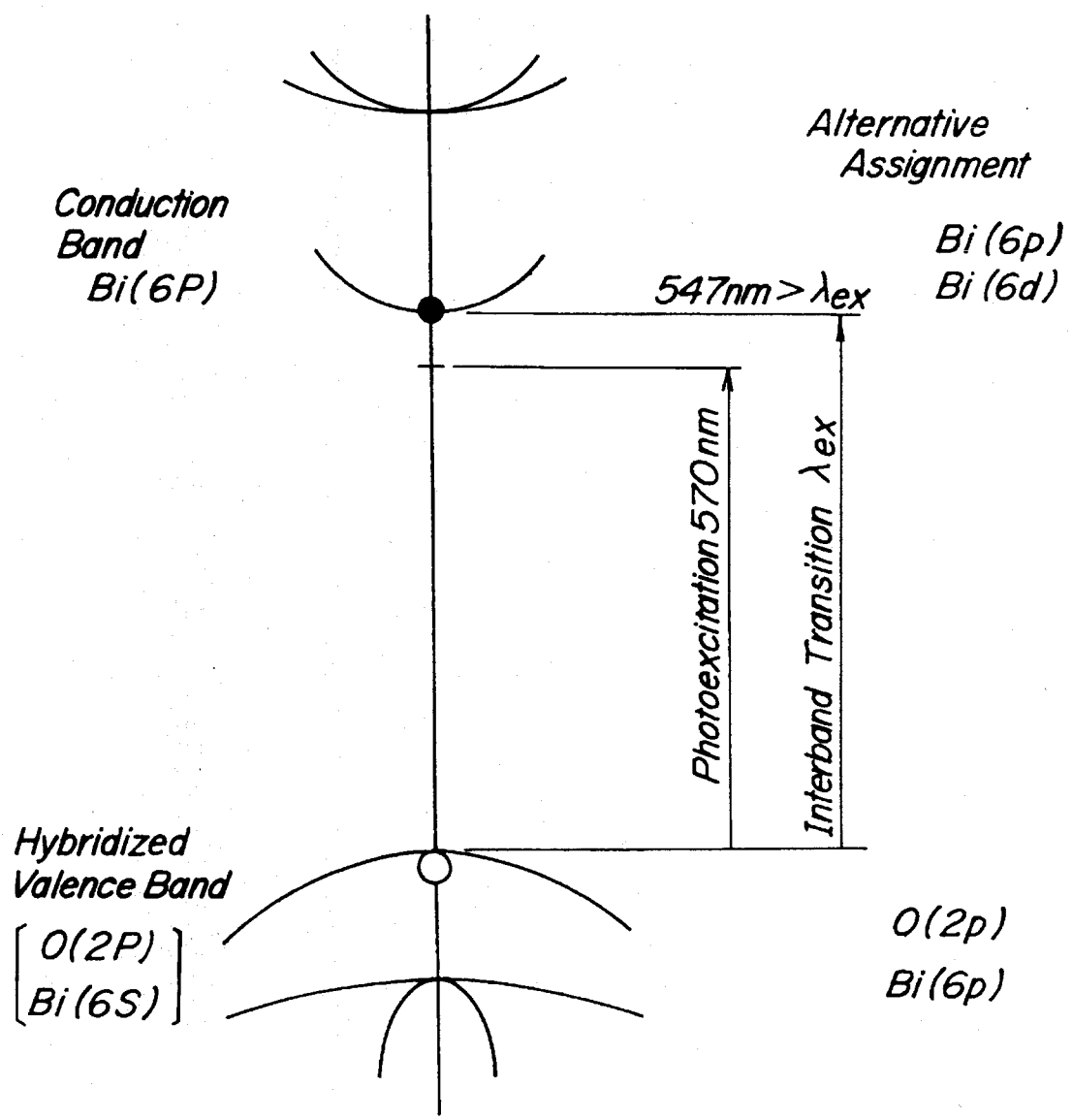
FIG_4

FIG_5a
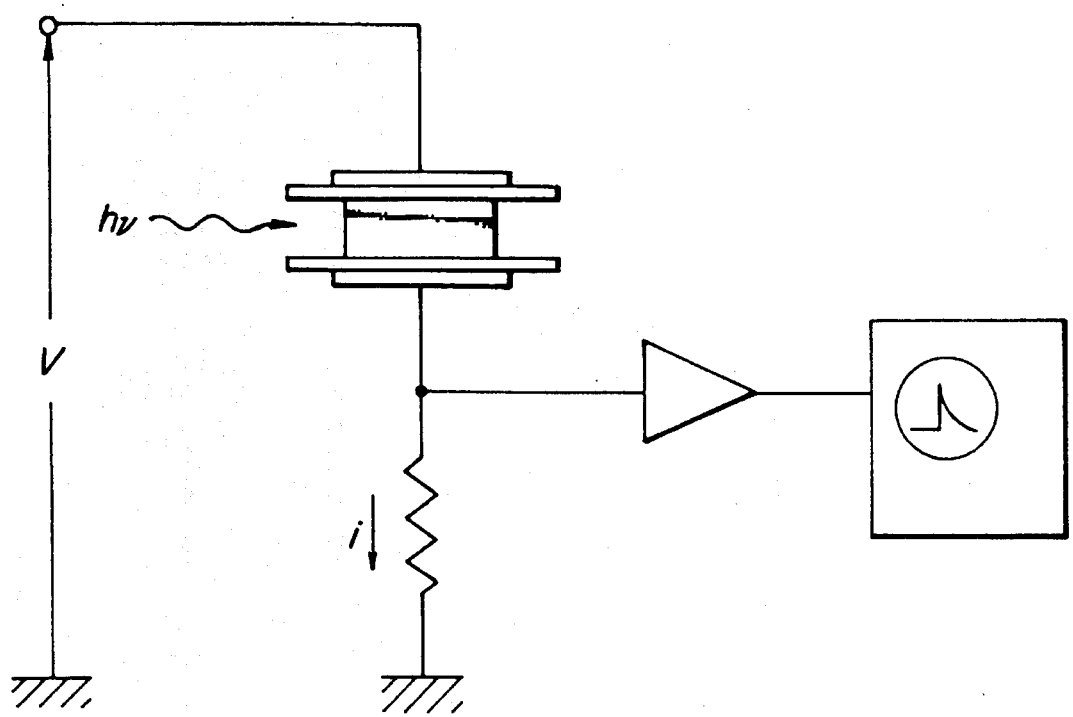
FIG_5b
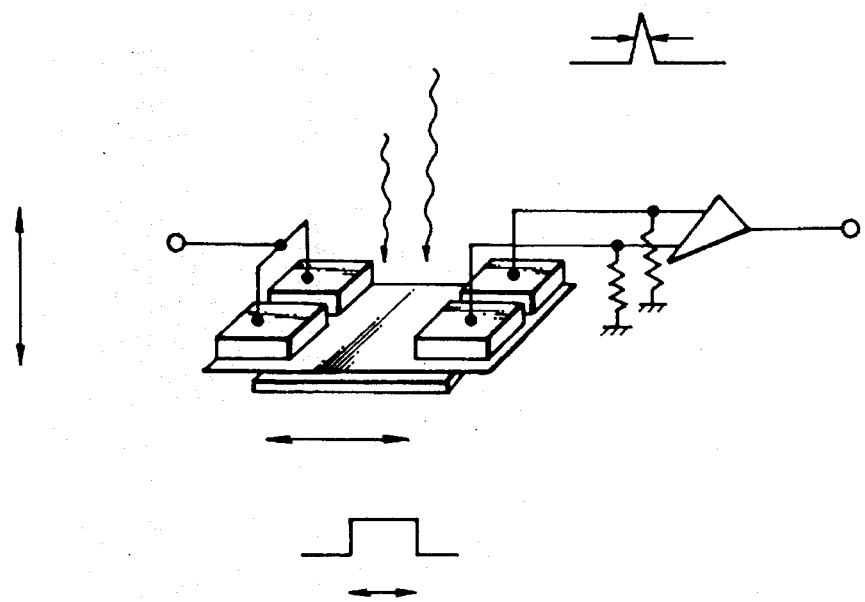

FIG_6
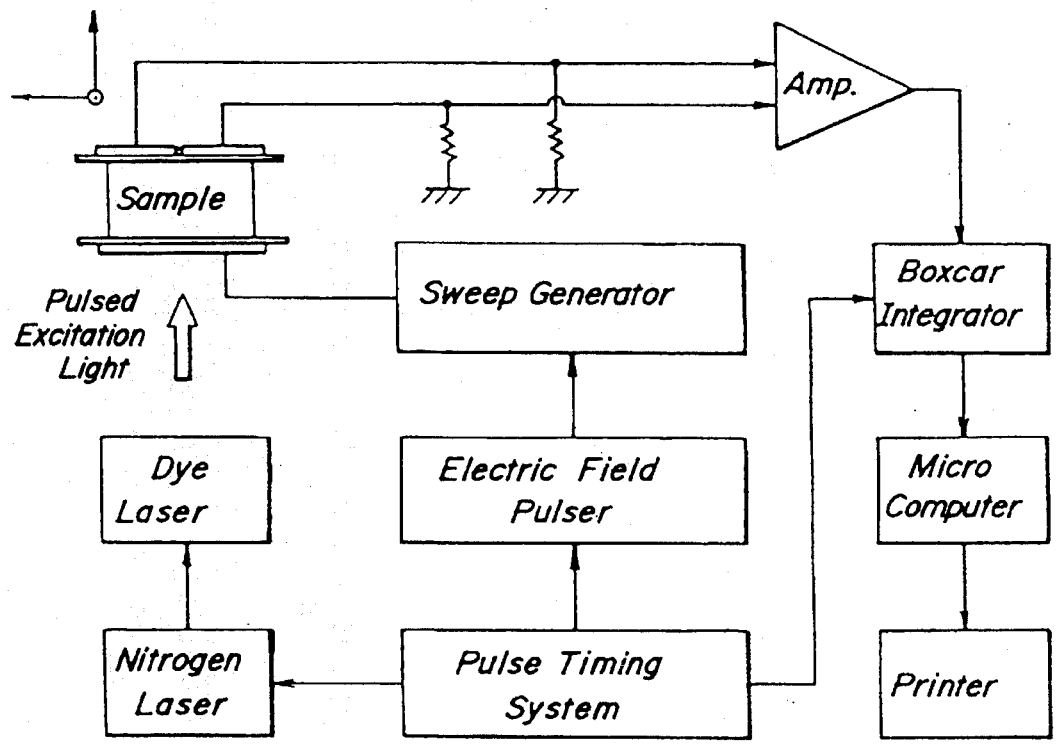

FIG_7a
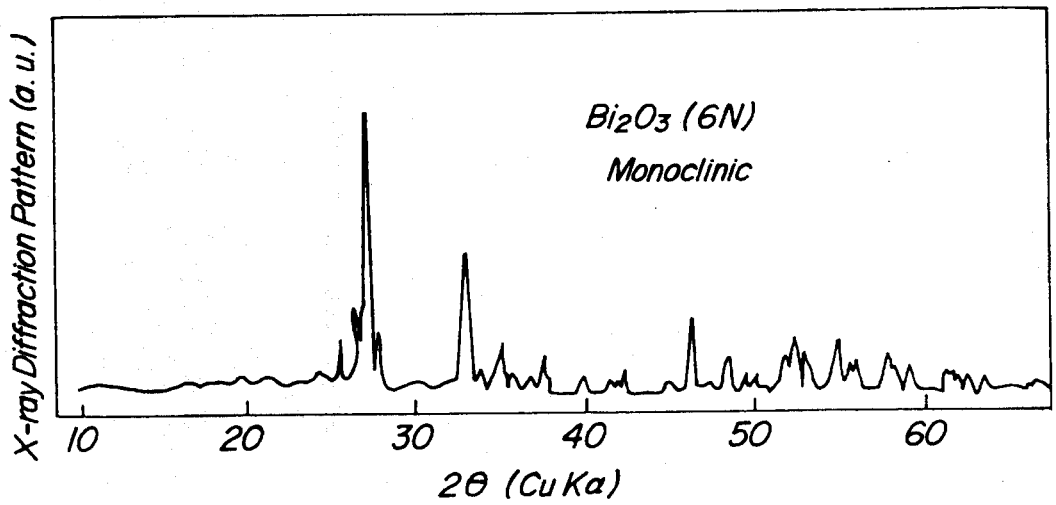
FIG_7b
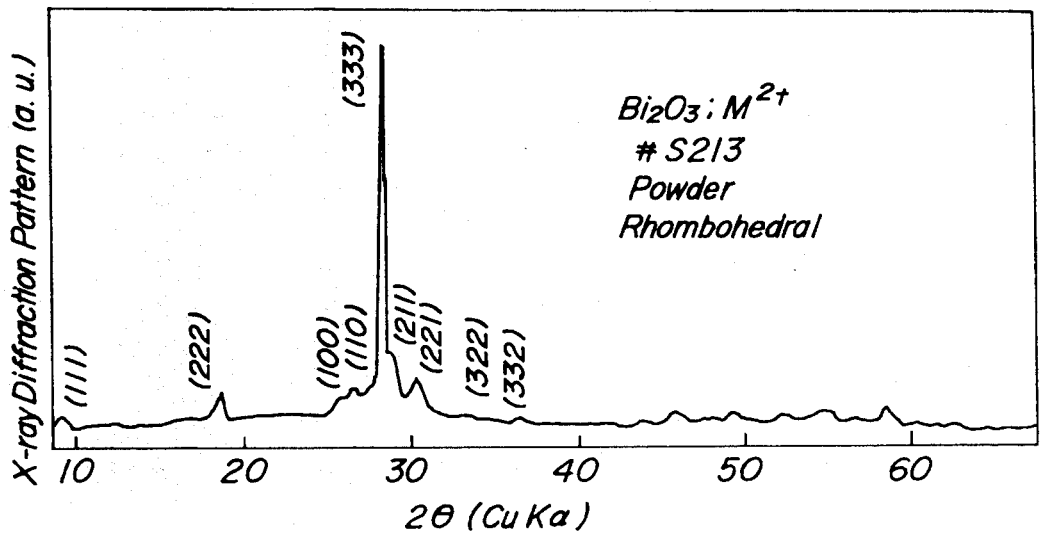

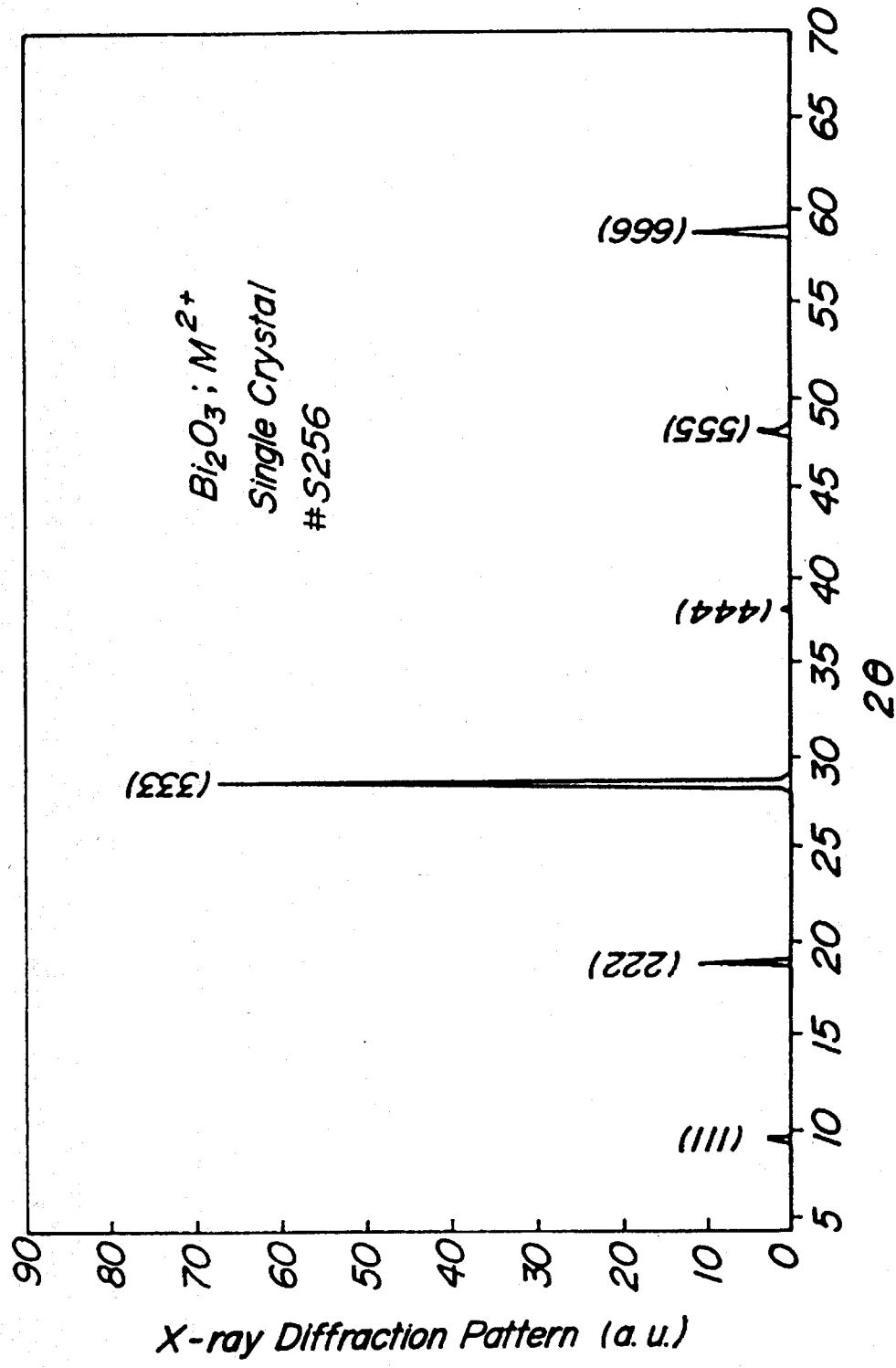

FIG_7d
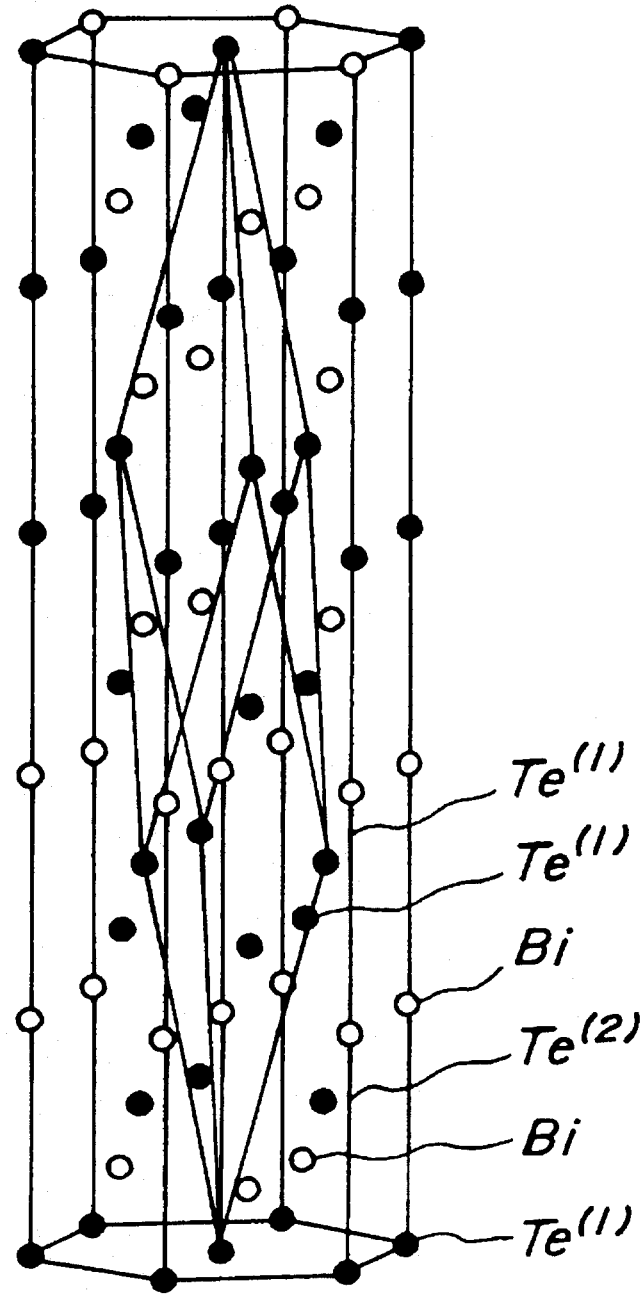
$Bi_2Te_3$
$a = 10.45 Å$
$\alpha = 24.8°$

FIG_7e
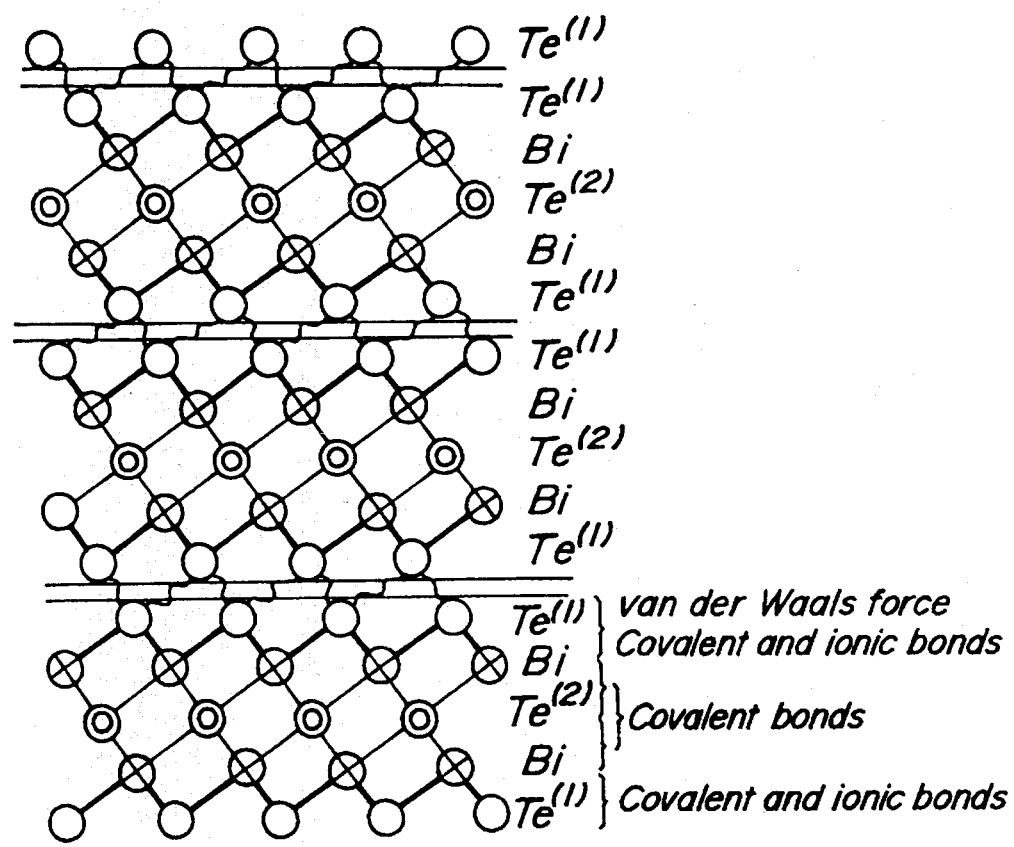

FIG_9a
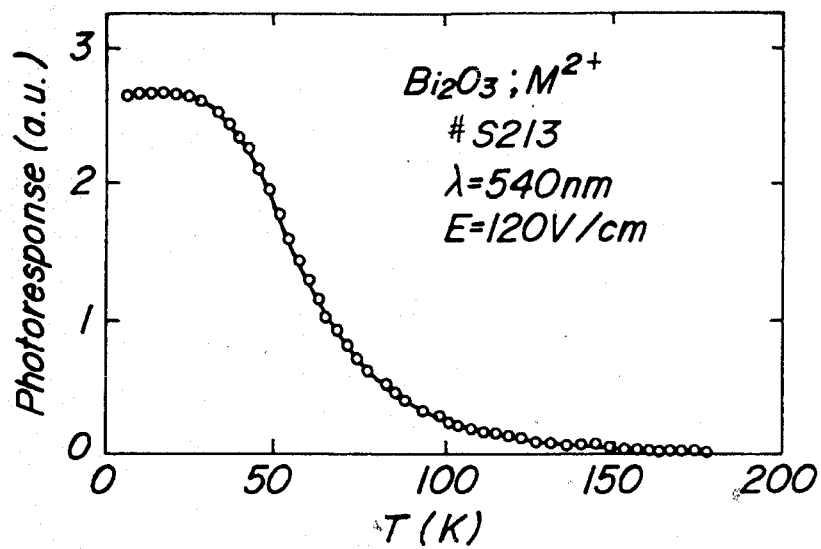
FIG_9b
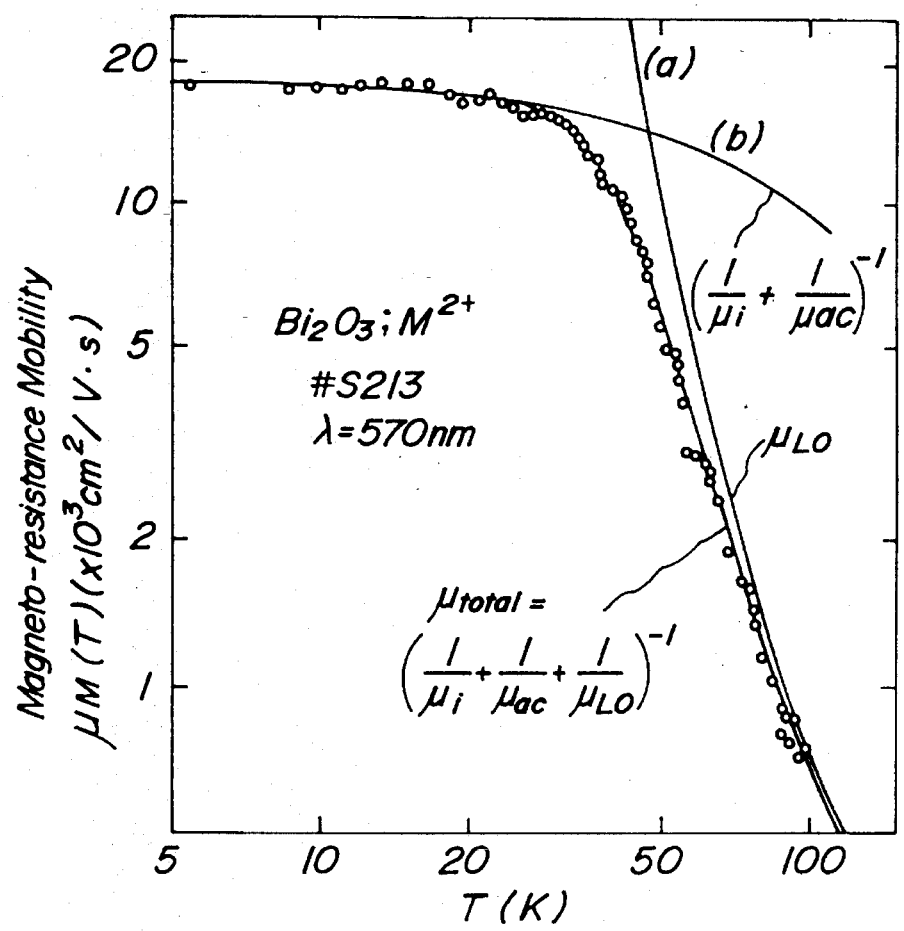

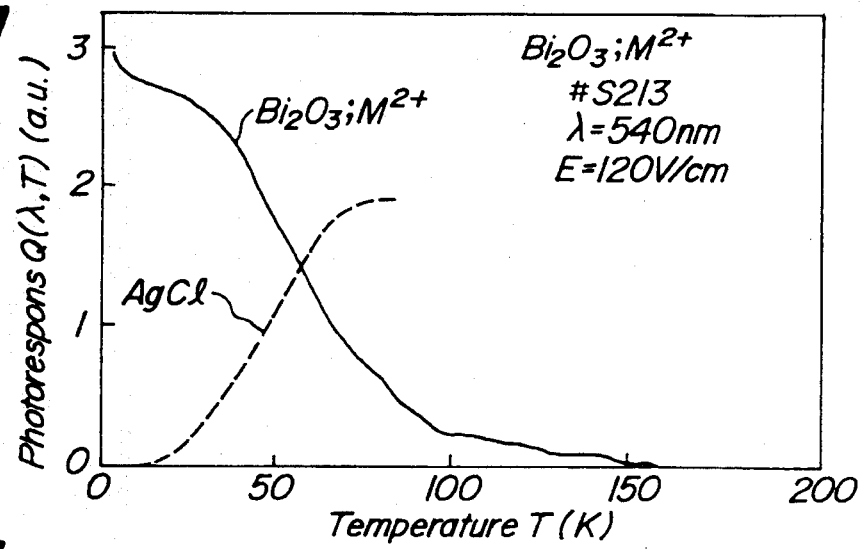
FIG._10a
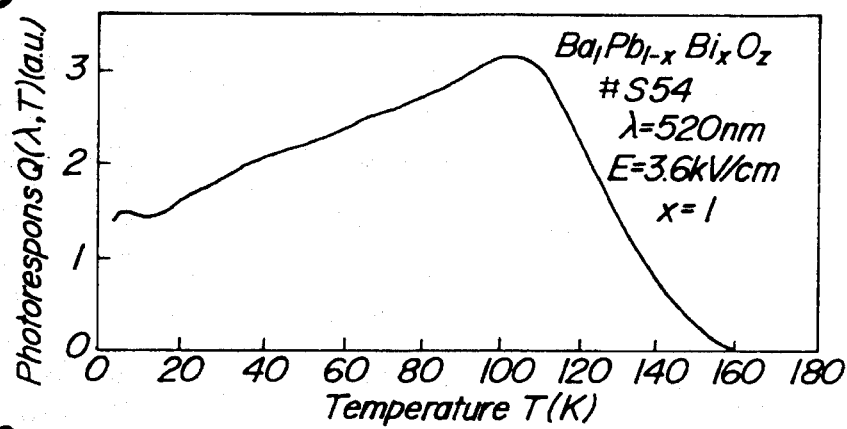
FIG._10b
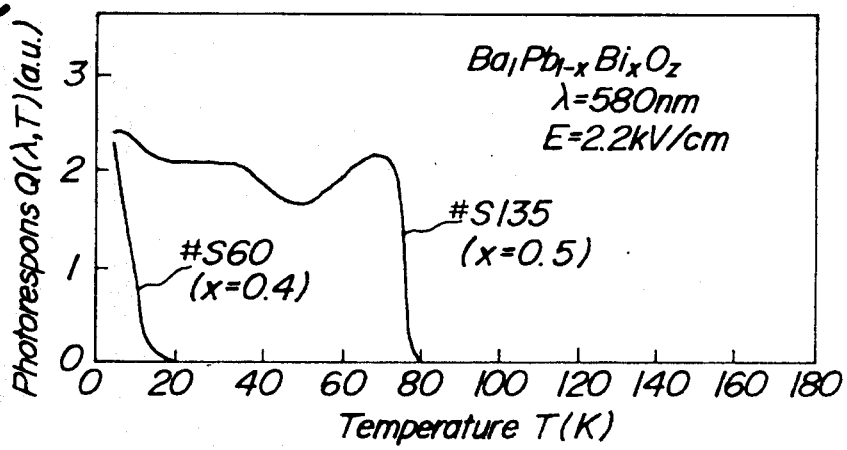
FIG._10c

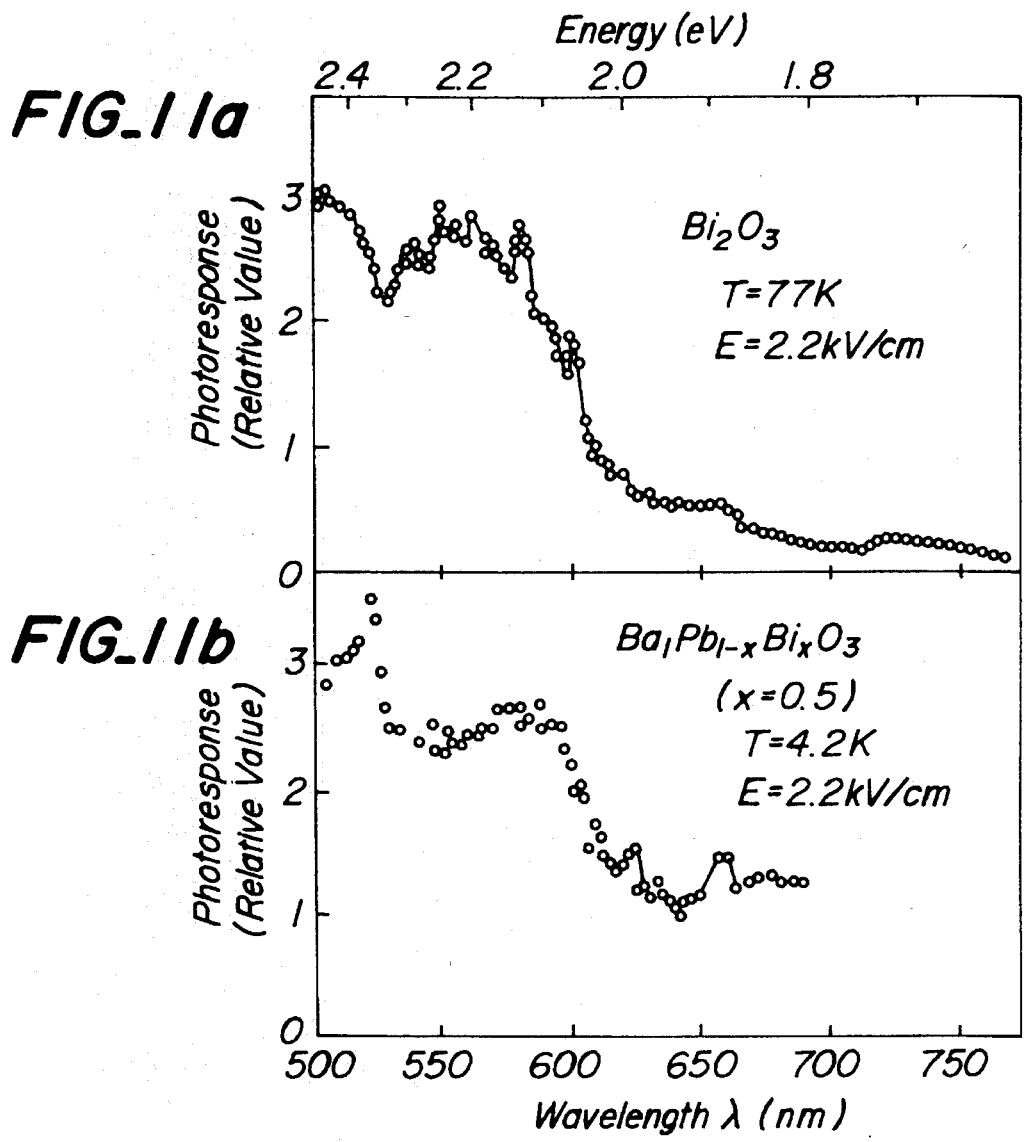

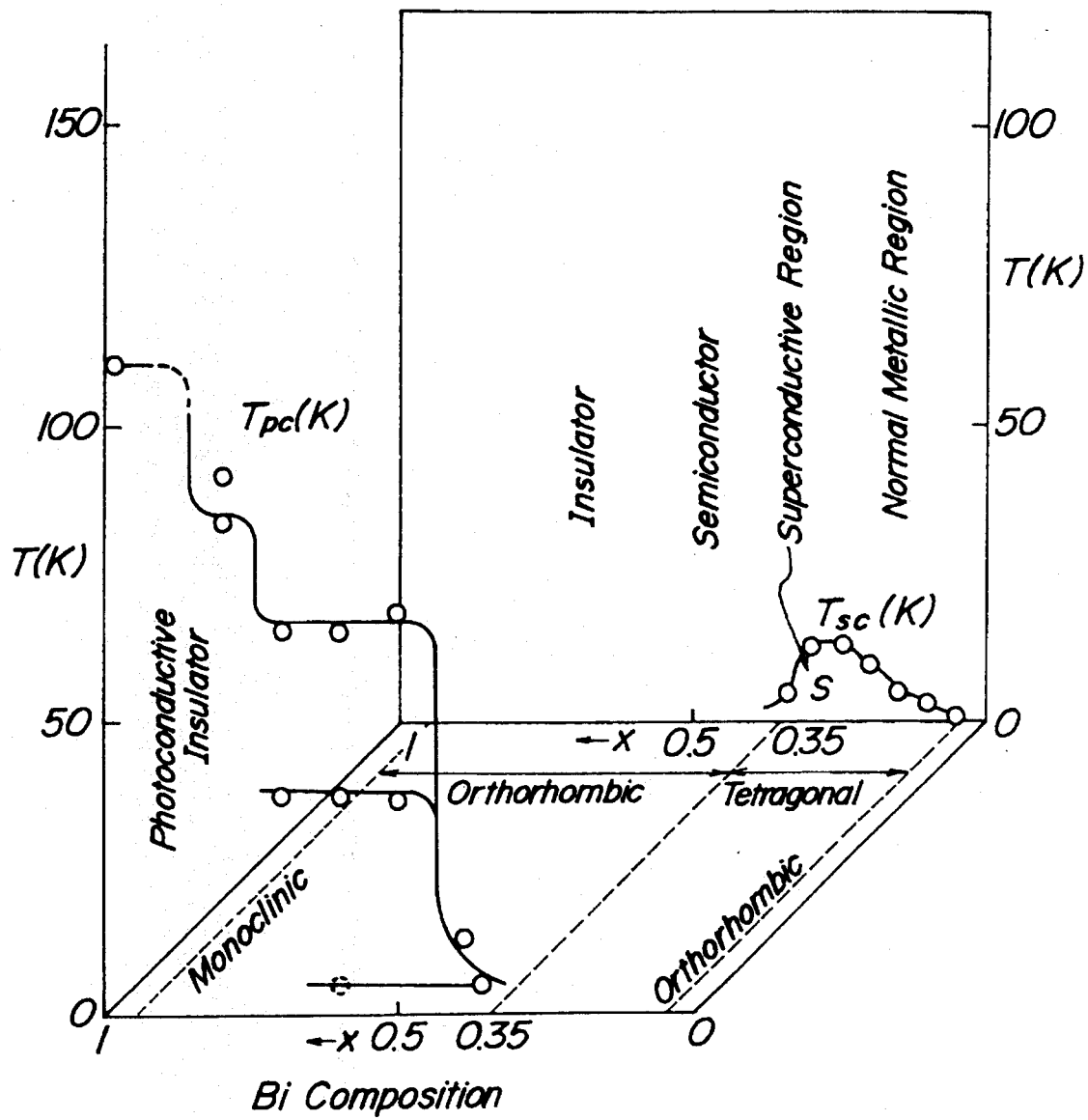
FIG_12a
$Ba_1-Pb_{1-x}-Bi_x-O_z$

FIG_12b
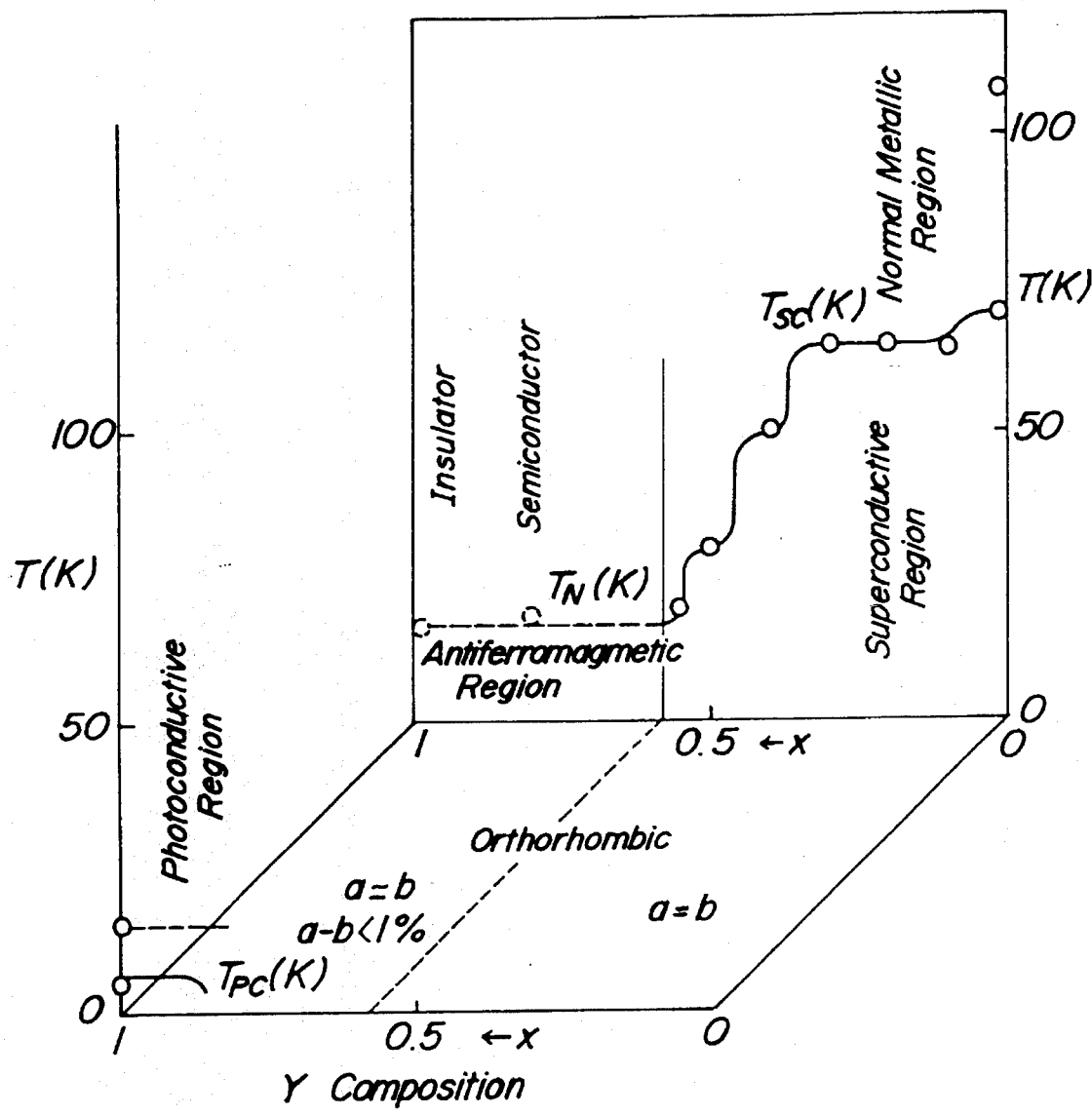

FIG_13a
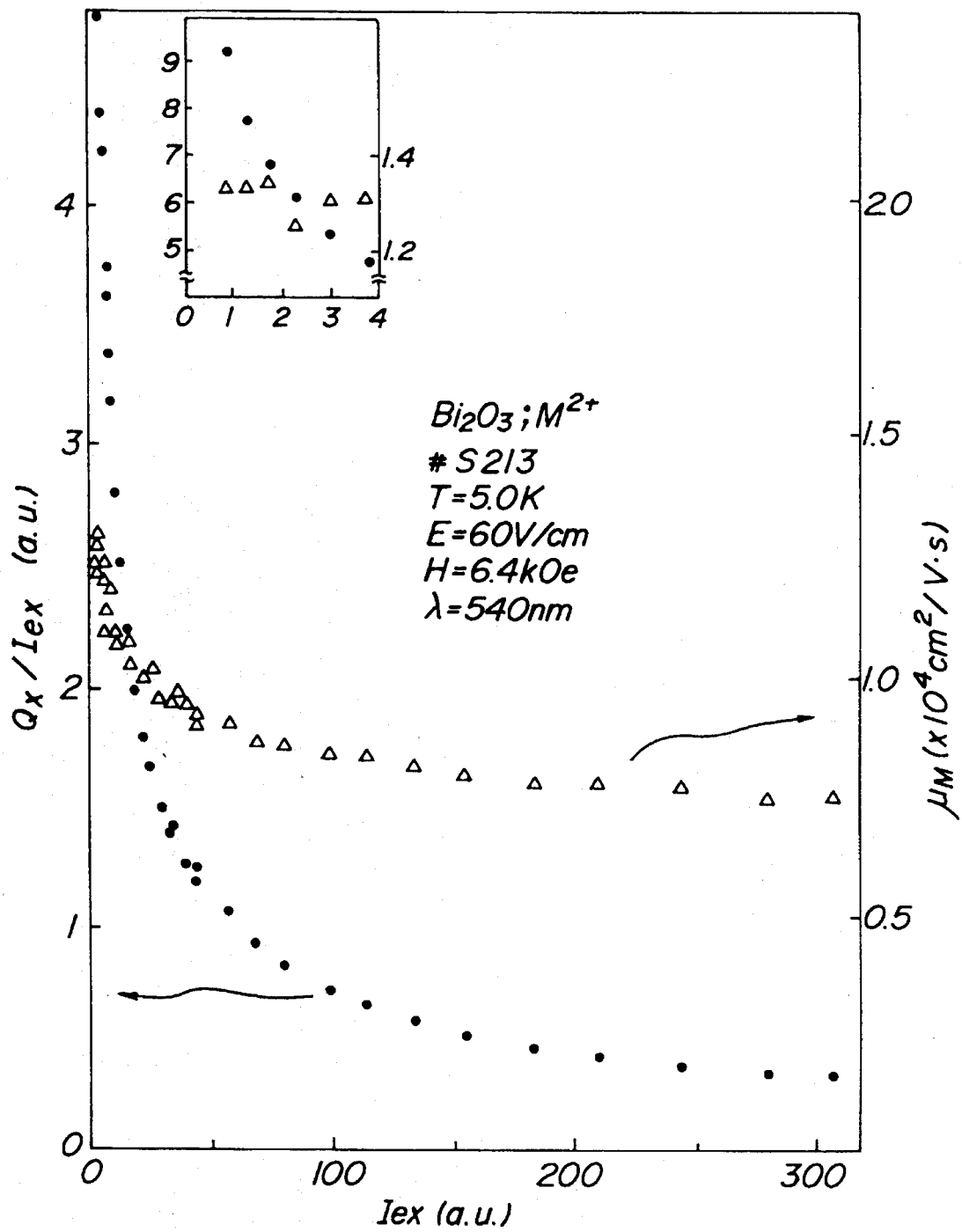

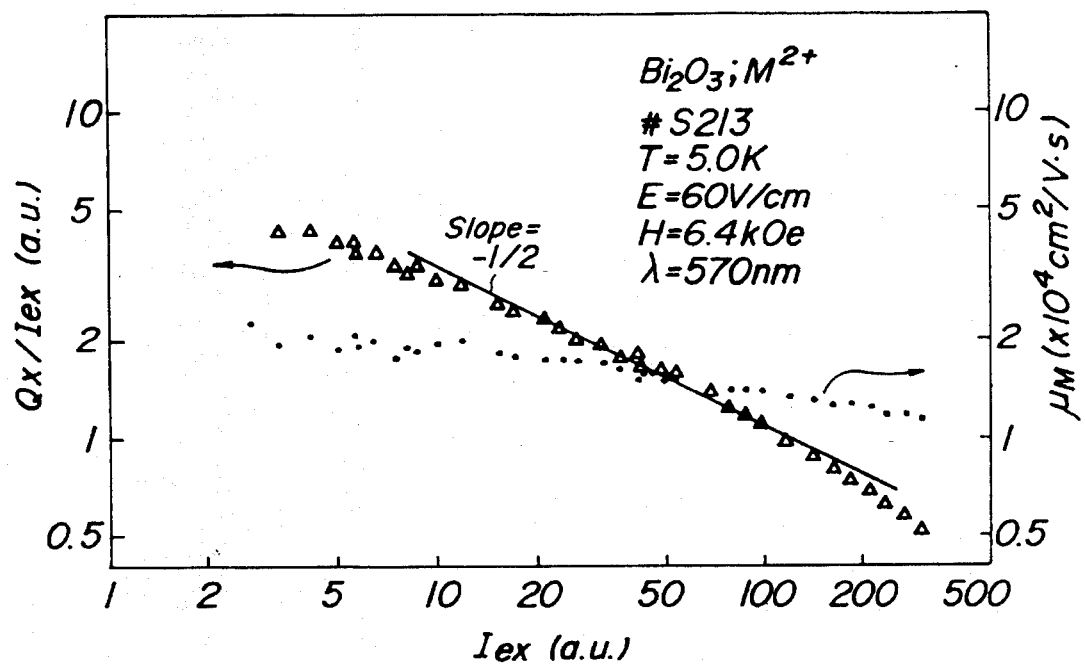
FIG_13b

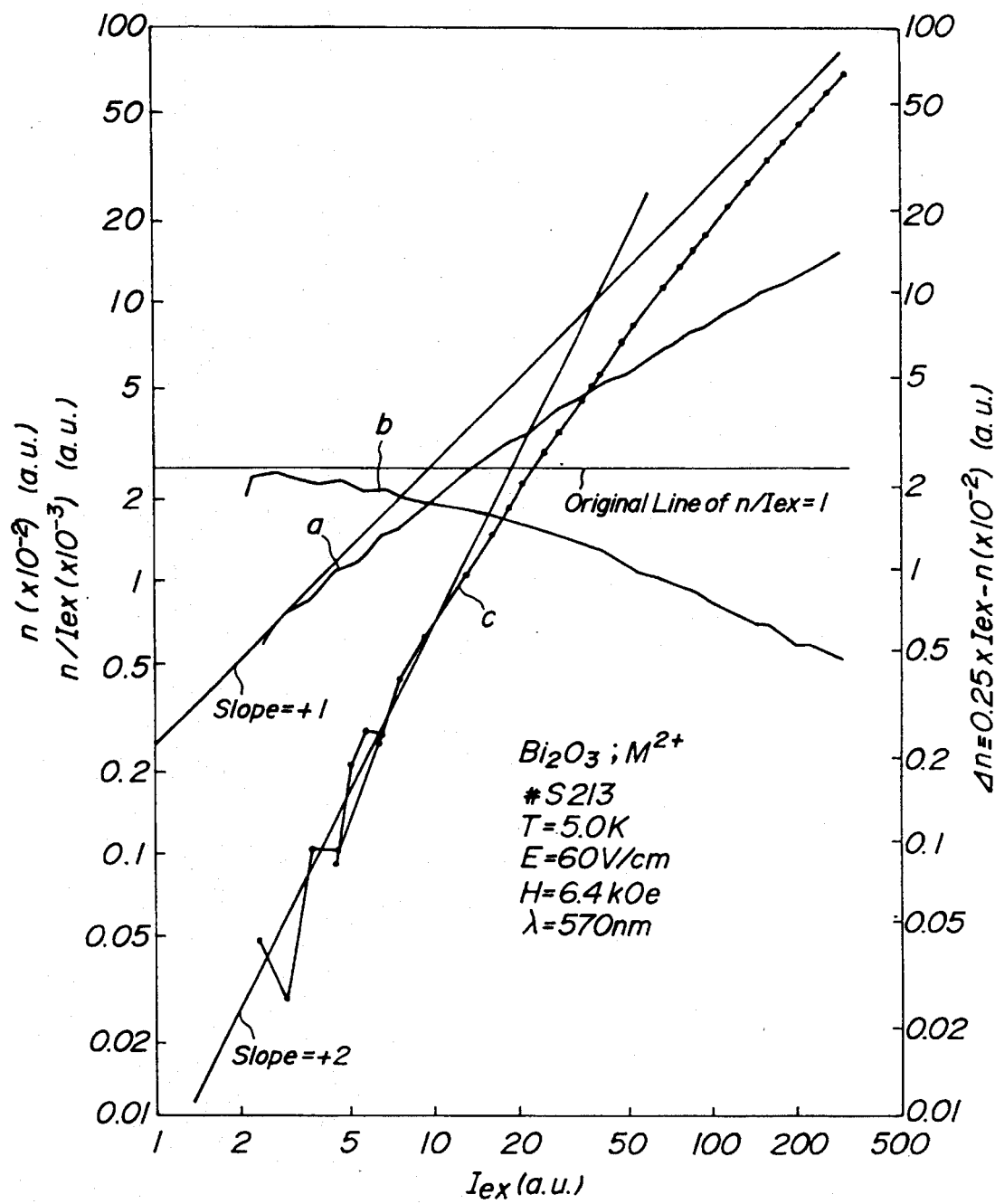
FIG_14

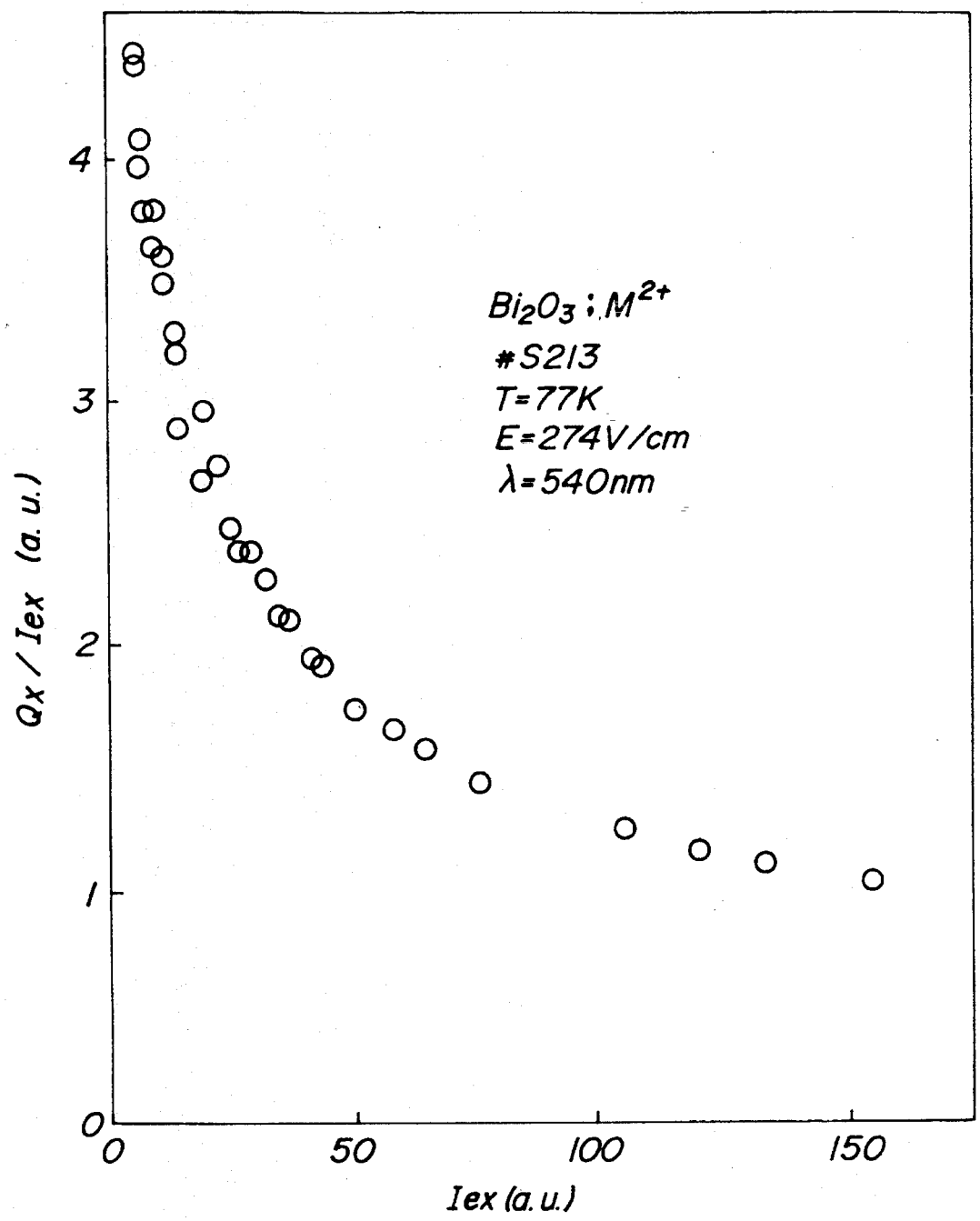
FIG_15a

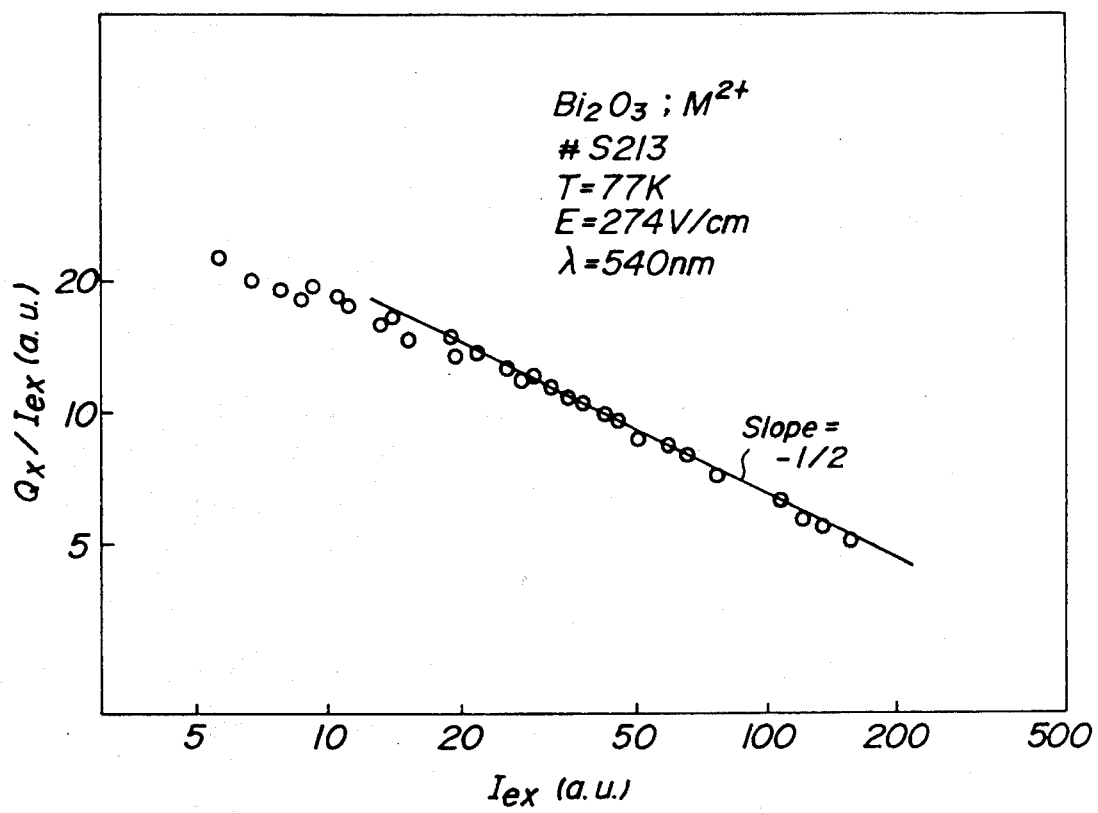
FIG_15b

FIG_16
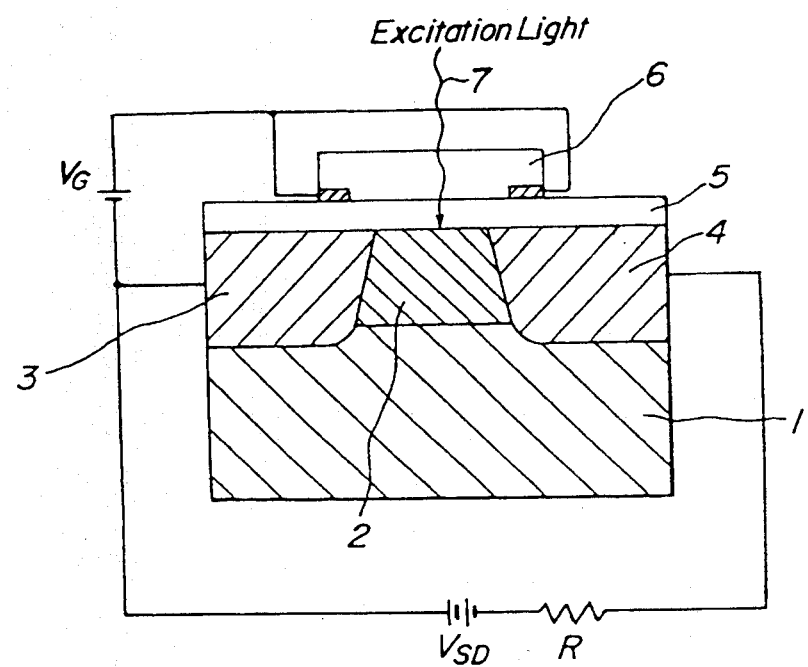
FIG_17
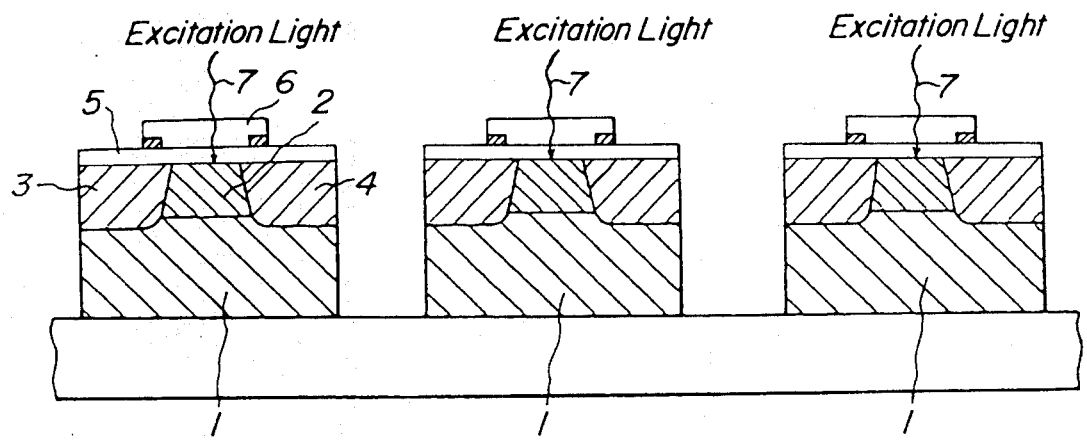

FIG_18a
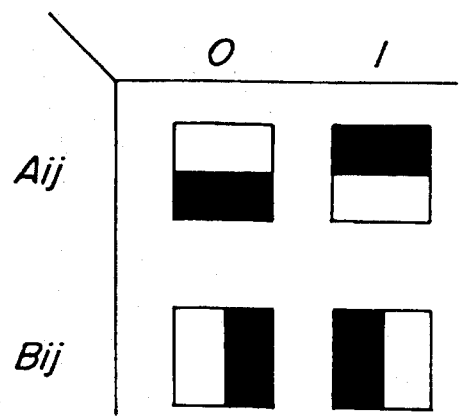
FIG_18b
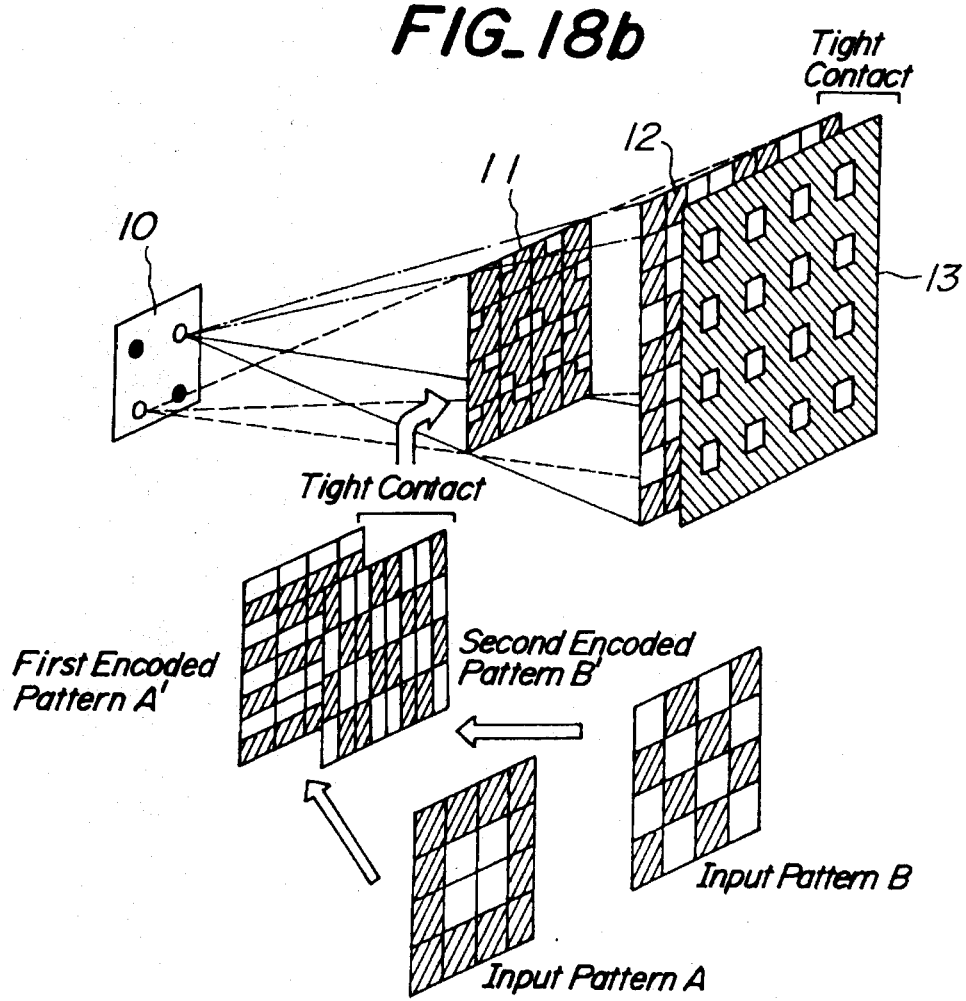

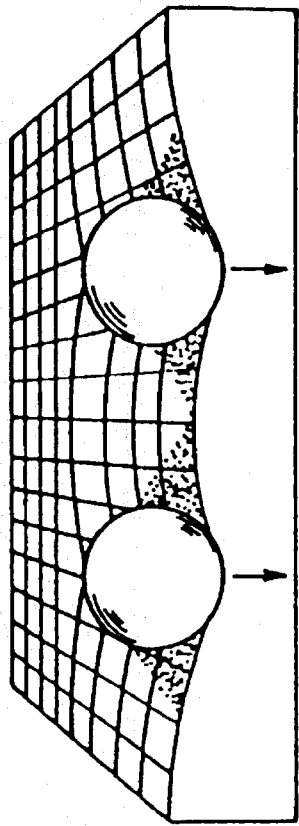
FIG_19b(b)
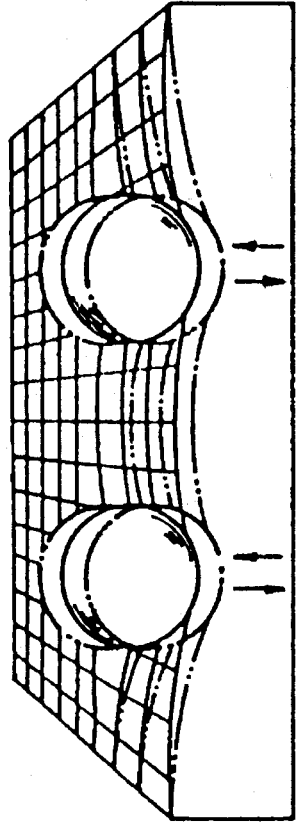
FIG_19b(d)
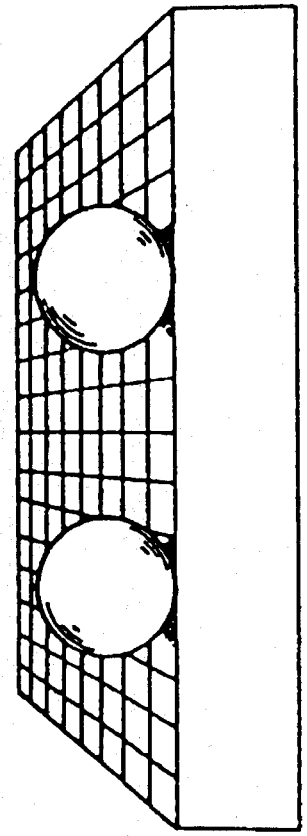
FIG_19b(a)
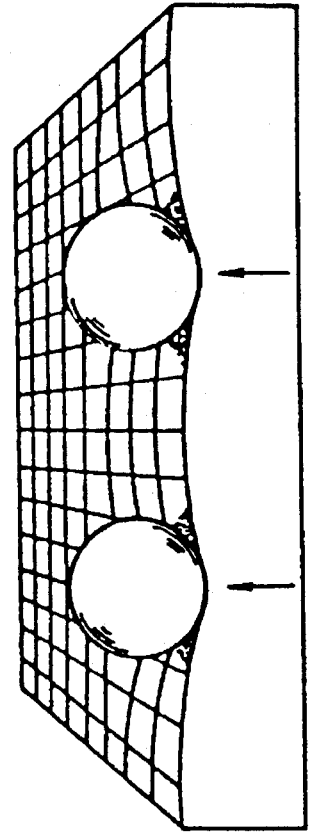
FIG_19b(c)

FIG_20a
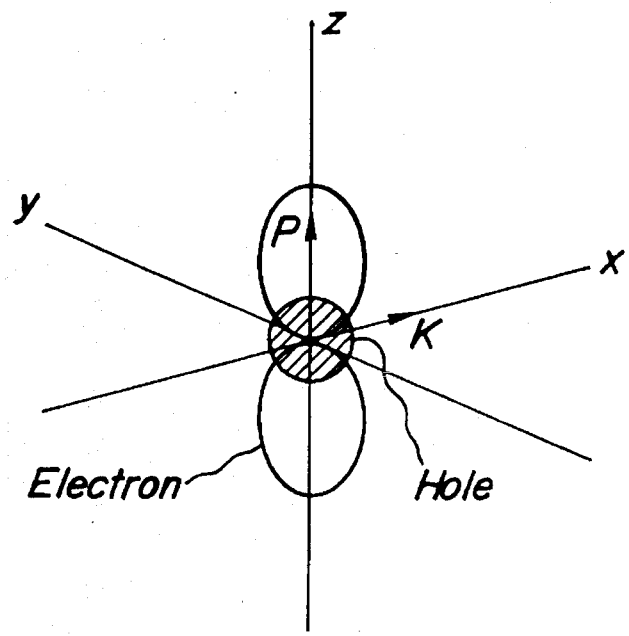
FIG_20b
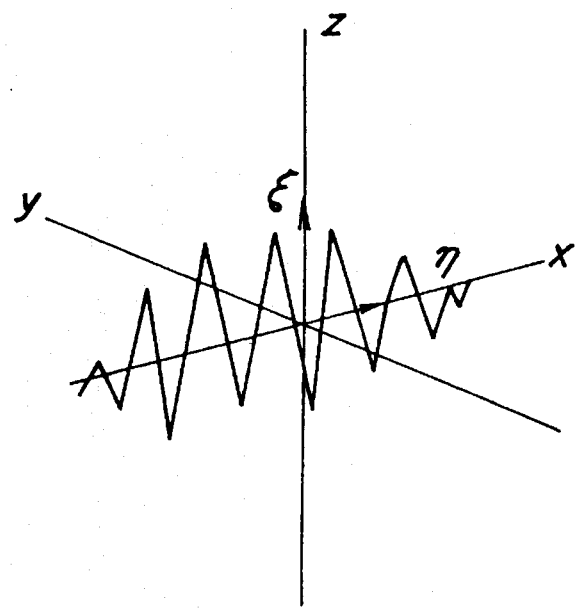

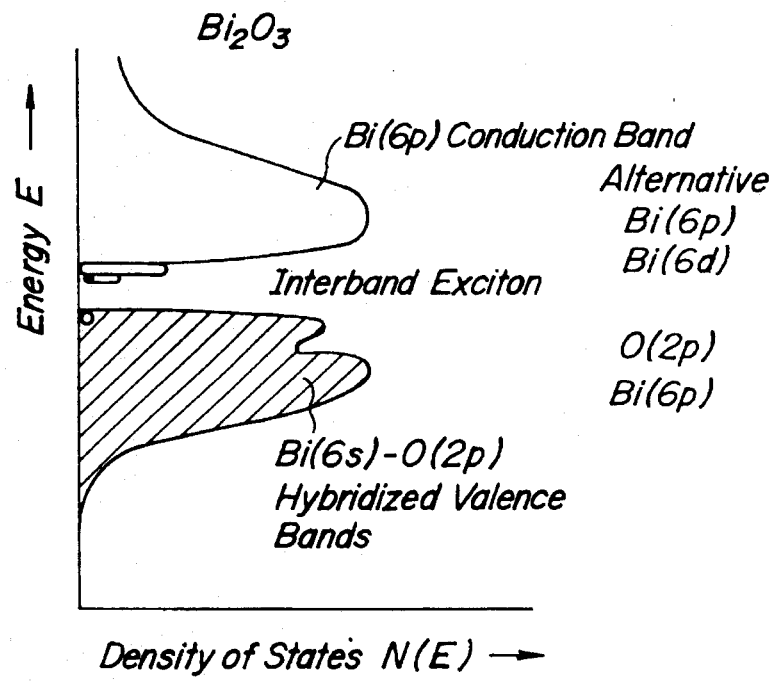
FIG_21a
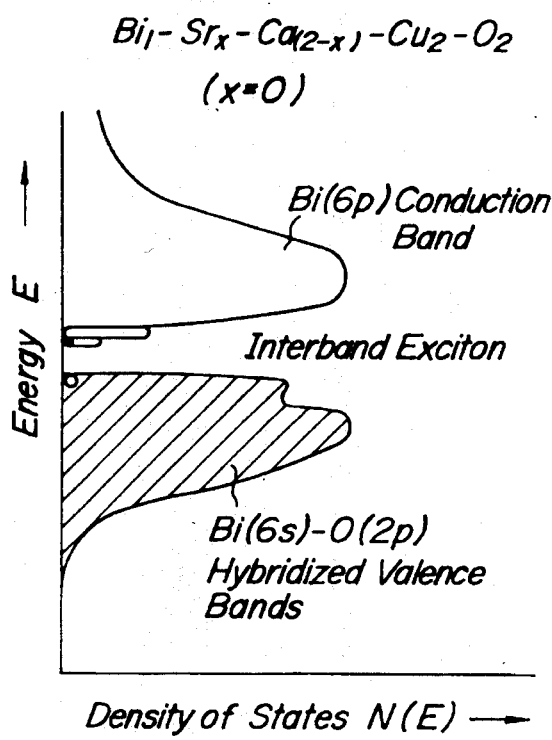
FIG_21b
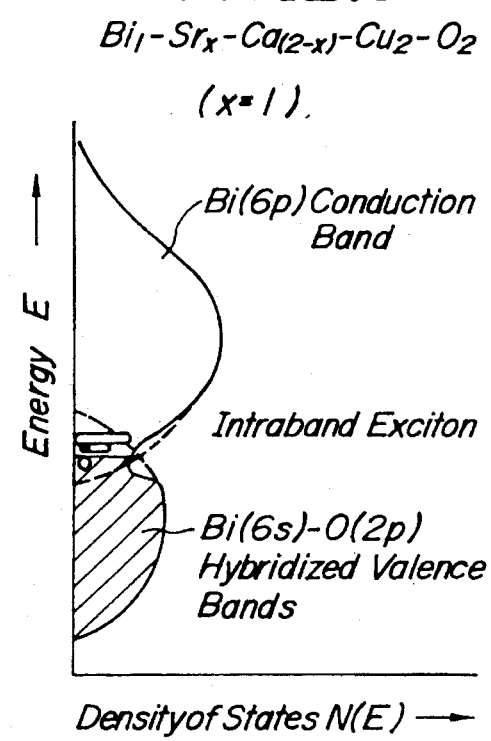
FIG_21c

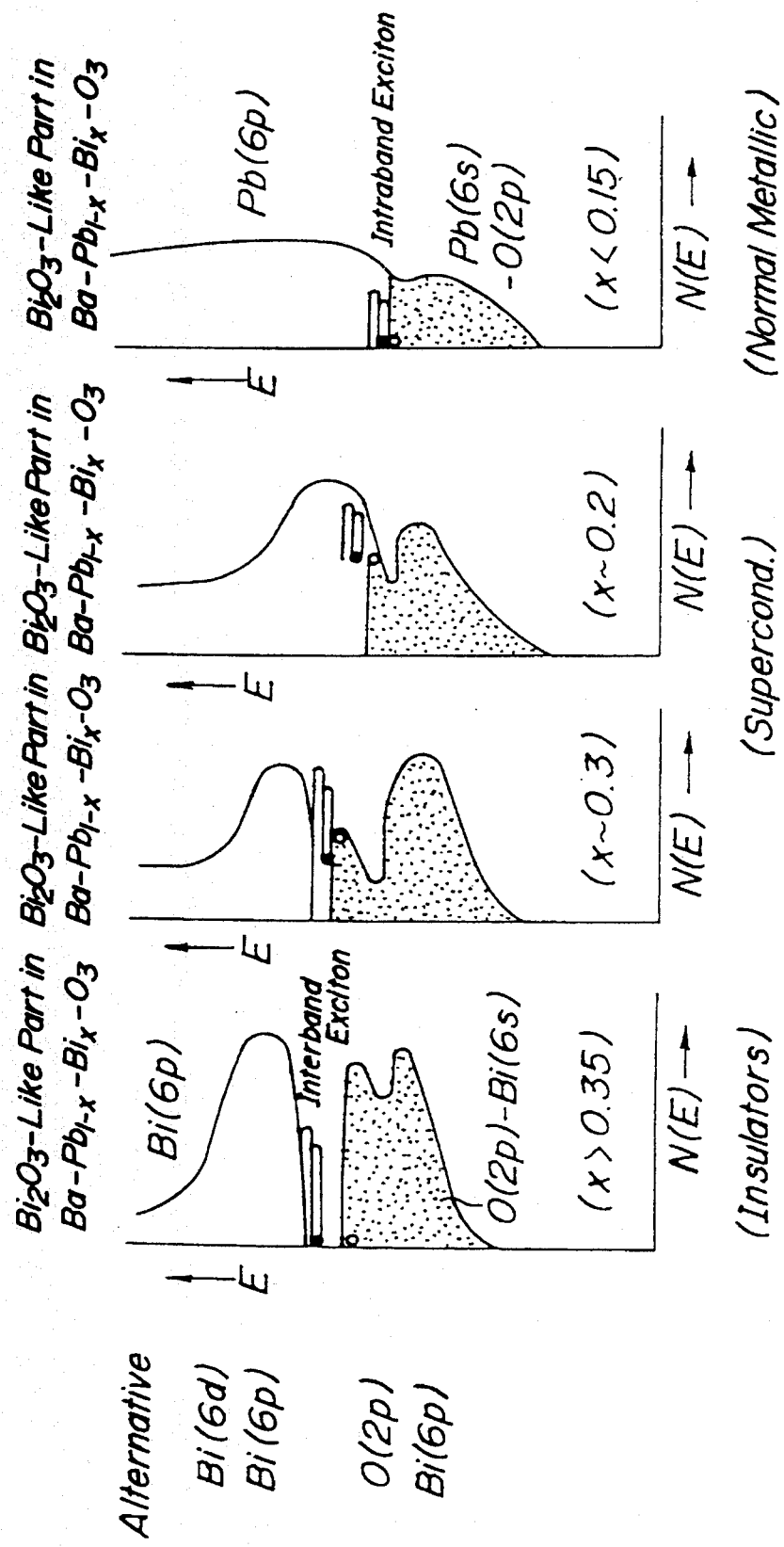

SUPERCONDUCTIVE OPTOELECTRONIC DEVICES WITH THE BASIC SUBSTANCE $Bi_2O_3$ OF SUPERCONDUCTIVE-CONJUGATE PHOTOCONDUCTIVITY

This is a Continuation of application Ser. No. 07/739,373 filed Aug. 2, 1991, now abandoned.

BACKGROUND OF THE INVENTION

Field of the Invention

This invention relates to a number of superconductive optoelectronic devices and superconductive optoelectronic apparatuses with a basic substance $Bi_2O_3$ or $Bi_2O_3;M^{2+}$ (M=Ca,Sr,Cu) of superconductive-conjugate photoconductivity. The superconductive optoelectronic devices and apparatuses of the present invention are novel and vastly different from those of prior art in that the invention uses a particular combination of the Bi-based superconductive oxide material and the basic material $Bi_2O_3$ or $Bi_2O_3;M^{2+}$ (M=Ca,Sr,Cu) of special superconductive-conjugate photoconductive character which reveals photoconductivity below the critical temperature of the Bi-based superconductive materials relevant to the basic substance $Bi_2O_3$.

The invention also relates to a superconductive optoelectronic apparatus with $Bi_2O_3$ or $Bi_2O_3;M^{2+}$ having a plurality with diversity of the superconductive optoelectronic devices produced therein in the form of integrated circuit at ultra high density, e.g. in two dimensional array form.

The invention stems from the inventor's important discovery of a phenomenon that a certain basic substance reveals photoconductivity at temperatures below the critical temperatures of superconductivity $T_{sc}$ of relevant superconductors, and such photoconductivity of that basic substance is in a conjugate relationship with the superconductivity of the relevant superconductors.

In the ensuing description, the "basic substance" refers to the substance with the above mentioned character, or that substance which reveals the superconductive-conjugate photoconductivity to be defined below. The basic substance to be used in the present invention is $Bi_2O_3$ or $Bi_2O_3;M^{2+}$ (M=Ca,Sr,Cu) and the relevant superconductors are the Bi-based oxides.

Here, we define "Superconductive-Conjugate Photoconductivity" to be a substantially new type of large photoconductivity in host insulators which emerges in several steps with decreasing temperature in accordance or correspondence with the critical temperatures of superconductivity in relevant conductive substances, all based on the discoveries and inventions disclosed by the present applicant before. "Photoconductivity" and "Superconductivity" are conjugate with each other in a certain group of systems, such as $Bi_2O_3$ and the Bi-based oxide superconductors.

DESCRIPTION OF THE PRIOR ART

With recent development of superconductive materials, various new superconductive substances have been found; for instance, superconductive oxide materials such as those of Y—Ba—Cu—O system and Bi—Sr—Ca—Cu—O systems. However, most of current research effort are focussed on the raising of transition temperature or critical current, and not thorough studies except those on the reflection or scattering have been made on either optical properties of superconductive substance or industrial applications of such optical properties. The reason for it is in that, generally speaking, researchers have considered that superconductivity is incompatible with such physical properties as optical absorption and photoconductivity and they have assumed that optical irradiation in the region of an excess amount of energy with the relevant wave number beyond the energy gap of the BCS theory will merely destroy the stability of superconductivity. Further, most of the superconductive materials which have been developed so far are metals or alloys or at least metallic, and no superconductive materials with useful optical properties have been found. No concept had existed, until the present inventor disclosed the first step, on a new field to be called "Superconductive Optoelectronics".

On the other hand, if a high-temperature superconductive oxide material is combined with a recently recognized basic material such as $Cu_2O$ or $Bi_2O_3$ of superconductive-conjugate photoconductivity which reveals its proper photoconductivity at temperatures below the transition temperatures of the relevant superconductive oxide materials, a number of new and more efficient electronic devices and optoelectronic apparatuses may be developed, for instance, a switching device with no power loss, an optically operating device with no power loss, an optically operating logical device, a space parallel type optically operating apparatus, a camera or an image forming device possibly with superconducting wiring, a high-speed optically operating apparatus to be driven at an extremely low power, and the like.

SUMMARY OF THE INVENTION

Although most researchers currently aim at the raising of transition temperatures of superconductive materials, the inventor has performed a number of experiments and analyses on optical properties of superconductive oxide materials, such as those of the Y—Ba—Cu—O and La—Cu—O system, Bi—Sr—Ca—Cu—O system and Ba—Pb—Bi—O system and eventually basic substances such as $Cu_2O$ and $Bi_2O_3$. Consequently, the inventor has discovered an entirely new and remarkable phenomenon in that some, at least two, of the above basic oxide substances are superconductive-conjugate photoconductive-materials to be defined as those which reveal onsets and steps of photoconductivity at temperatures in accordances or correspondences with the critical temperature for superconductivity (transition point) of all relevant superconductive materials which are related to the superconductive-conjugate photoconductive-materials. The basic substances of superconductive-conjugate photoconductive oxide materials are so far as electric insulators or semiconductors at room temperature, but when they are cooled down to the temperatures below the transition points of the relevant superconductive materials related to them, they reveal photoconductivity, i.e., they enhance life time of photocarriers to be observable and their conductivity varies depending on the intensity of the excitation light which is incident thereto.

A power-loss-free useful superconductive optoelectronic device can be formed by combining a basic substance, e.g., $Bi_2O_3$ of superconductive-conjugate photoconductive-material with its related Bi-based superconductive material, for instance, the Bi—Sr—Ca—Cu—O system. What is meant by "superconductive optoelectronic device with basic substance" is an optoelectronic device made of a combination of a superconductive material of one oxide system and a basic substance of superconductive-conjugate photoconductive-materials of the same oxide system which reveals photoconductivity at temperatures below the critical temperatures of the relevant superconductive oxide material.

An object of the invention is to provide a novel superconductive optoelectronic device by using effectively the optical properties of a "basic substance" such as $Bi_2O_3$ or $Bi_2O_3;M^{2+}$ (M=Sr,Ca,Cu) of the superconductive-conjugate photoconductive-materials, which is newly discovered by the inventor for the Bi-based oxide superconductors. Thus, the invention is neither a mere improvement of the prior art nor a simpler solution of problems existing in the prior art, but an entirely new achievement.

A superconductive optoelectronic device according to the present invention, for instance, comprises a substrate, a photoconductive gate region formed on the substrate, and a source region and a drain region formed on the substrate at opposite sides of the gate region respectively so as to face toward each other across the gate region. The source and drain-regions are made of a superconductive oxide material, while the gate region is made of a basic substance of superconductive-conjugate photoconductive-materials which reveals photoconductivity at temperatures below the critical temperature for superconductivity of the relevant superconductive materials. The basic substance of the superconductive-conjugate photoconductive-material and the superconductive material are of common origin but with different contents of constituent elements.

Bias source may be connected across the source region and the drain region of the optoelectronic devices of the invention, so as to drive an electric current through its photoconductive gate region depending on the intensity of light which is incident to the photoconductive gate region.

Once such a type of superconductive optoelectronic device is formed with a basic substance $Bi_2O_3$ or $Bi_2O_3;M^{2+}$, it must be naturally straight forward to develop the new field from such a device to other devices, and eventually to superconductive optoelectronic apparatus with a basic substance $Bi_2O_3$ or $Bi_2O_3;M^{2+}$, for instance a switching device with no power loss, an optically operating device with no power loss, an optically operating logical device, a space parallel type optically operating device, a camera or an image forming device possibly with superconducting wiring, a high-speed optically operating apparatus to be driven at an extremely low power with highest optical efficiency, and the like.

BRIEF DESCRIPTION OF THE DRAWINGS

For a better understanding of the invention, reference is made to the accompanying drawings, in which:

FIG. 1 schematically displays a few intercorrelations between basic substances or host insulators and a series of high-$T_c$ superconductors;

FIGS. 2a–2c display the temperature dependences of transient photoconductivity $Q(T,\lambda)$ of (a) the basic material $Bi_2O_3$ (ceramic) at $\lambda=660$ nm E=4.3 kV/cm, (b) the basic material $Bi_2O_3;M^{2+}$ (M=Sr,Ca,Cu) (S213), single crystal at $\lambda=540$ nm and E=120 V/cm, and (c) $Bi_1$—$Sr_x$—$Ca_{2-x}$—$Cu_2$—$O_z$ system (x=0), respectively. All of these are typical examples of the superconductive-conjugate photoconductivity. FIG. 2d exemplifies typical dark resistivity $\rho(T)$ of the $Bi_1Sr_xCa_{2-x}$—$Cu_2O_z$ system (x=1);

FIGS. 3a, 3b and 3c indicate the wavelength dependence of the superconductive-conjugate photoconductivity $Q(T,\lambda)$ of (a) the basic substance $Bi_2O_3$ sintered ceramics at T=77K, E=2.2 kV/cm and (b) the $Bi_2O_3;M^{2+}$ (M=Sr,Ca,Cu), single crystal at T=5.0K, E=120 V/cm, and the $Bi_1$—$Sr_x$—$Ca_{2-x}$—$Cu_2$—$O_z$ system (x=0), respectively;

FIG. 4 is a schematic illustration of the valence bands and conduction bands of $Bi_2O_3$ near the zone center together with two wavelengths of photoexcitations at $\lambda=547, 570$ nm indicated;

FIGS. 5a and 5b indicate the basic principle of technique to detect transient photoconductivity signals $Q(T,\lambda)$ in insulators with two arrangements of blocking electrodes;

FIG. 6 exemplifies a block diagram of circuit arrangement for the transient photoconductivity measurement for insulators;

FIGS. 7(a), 7(b), 7(c), 7(d), and 7(e) indicate the X-ray diffraction patterns of (a) $Bi_2O_3$ ceramic powder (6N) (monoclinic) and (b) powdered $Bi_2O_3;M^{2+}$ (#S213 rhombohedral) and (c) single crystal of $Bi_2O_3;M^{2+}$ (#S256), and FIG. 7(d) the $Bi_2Te_3$ like crystal structure and (e) the bonding characters of $Bi_2Te_3$ similar to those of $Bi_2O_3$;

FIG. 9a exhibits the temperature dependence of photoconductivity $Q(T,\lambda)$ of single crystal $Bi_2O_3;M^{2+}$ (#S213) at $\lambda=540$ nm, E=120 V/cm;

FIG. 9b exhibits the magneto-resistance mobility $\mu_M(T)$ of electrons and positive holes in $Bi_2O_3;M^{2+}$ (#S213, $\lambda=570$ nm) as a function of temperature, both in logarithmic scales, wherein solid lines illustrate the results of fitting of temperature dependence of $\mu_M(T)$ in terms of a combination of the effects of optical and acoustic phonon and neutral impurity scatterings;

FIGS. 10(a), (b) and (c) display the temperature dependences of superconductive-conjugate photoconductivity $Q(T,\lambda)$ of (a) the basic material $Bi_2O_3;M^{2+}$(#S213) at $\lambda=540$ nm and E=120 V/cm and (b) the $Ba_1Pb_{1-x}Bi_xO_z$ system (#S54, x=1, $\lambda=520$ nm, E=3.6 kV/cm), respectively together with an example of normal photoconductivity of AgCl in FIG. 10(a). FIG. 10(c) illustrates the temperature dependences of superconductive-conjugate photoconductivity $Q(T,\lambda)$ of $Ba_1Pb_{1-x}Bi_xO_z$ (x=0.4), (#S60) and (x=0.5)(#S135), respectively, at $\lambda=580$ nm, E=2.2 kV/cm;

FIGS. 11(a) and 11(b) display the wavelength dependence of superconductive-conjugate photoconductivity $Q(T,\lambda)$ of the basic substance of $Bi_2O_3$ at E=2.2 kV/cm, T=77K and the $Ba_1Pb_{1-x}Bi_xO_z$ (x=0.5) at E=2.2 kV/cm, T=4.2K;

FIGS. 12(a) and 12(b) indicate the phase diagram of (a) the $Ba_1$—$Pb_{1-x}$—$Bi_x$—$O_z$ system and (b) the $Bi_2$—$Sr_2$—$Ca_{1-x}$—$Y_x$—$Cu_2$—$O_z$ system in thermal equilibrium in the dark and also a quasi-phase diagram at photoexcitation, respectively;

FIG. 13(a) indicates characteristic dependences of the relative photoresponse on the intensity of photoexcitation $I_{ex}$ of $Bi_2O_3;M^{2+}$ (#S213 single crystal), $Q_x/I_{ex}$, and the magneto-resistance mobility, $\mu_M$, at T=5.0K, $\lambda=540$ nm, E=60 V/cm, H=6.4 KOe;

FIG. 13(b) indicates a logarithmic replotting Of $(Q_x/I_{ex})$ and $\mu_M$ of $Bi_2O_3;M^{2+}$ (#S213) in FIG. 13(a) on the intensity of photoexcitation $I_{ex}$;

FIG. 14 indicates a logarithmic plotting of the carrier density ($n/I_{ex}$) and $\Delta n$ of $Bi_2O_3;M^{2+}$ (#S213) on the intensity of photoexcitation $I_{ex}$ at T=5.0K, $\lambda=570$ nm, E=60 V/cm, H=6.4 KOe); and FIG. 15(a) and (b) indicates a characteristic plotting of $Q_x/I_{ex}$ of $Bi_2O_3;M^{2+}$ on the $I_{ex}$ at 77K in (a) linear scale and (b) logarithmic scale;

FIG. 16 is a schematic sectional view of a superconductive optoelectronic device according to the invention;

FIG. 17 is a schematic partial sectional view of a superconductive optoelectronic alley device according to the invention;

FIGS. 18a and 18b are a diagrammatic illustration of a space parallel optically operating superconductive optoelectronic apparatus which uses alleys of the superconductive optoelectronic devices of the invention (A) a method of encoding input signals and (B) a mode of projection by a light source, e.g., LED array for operation;

FIGS. 20(a) and 20(b) illustrate a schematic form of (a) an exciton with a wavevector K and transition moment P, which sometimes couples with (b) photons with a wavevector $\eta$ and the direction of polarization $\xi$;

FIG. 21(a), 21(b) and 21(c) depict schematically the density of states N(E) as a function of Energy E for (a) $Bi_2O_3$ or $Bi_2O_3;M^{2+}$ insulators, (b) $Bi_1Sr_xCa_{2-x}Cu_2O_z$ (x=0 insulator) and (c) $Bi_1Sr_xCa_{2-x}Cu_2O_z$ (x=1 superconductor) respectively; and FIG. 22a–22d depicts schematically the density of states N(E) as a function of Energy E for the $BaPb_{1-x}Bi_xO_z$ system (a) (x>0.35 insulators), (b) (x≈0.3 superconductor), (c) (x≈0.2 superconductor) and (d) (x<0.15 normal metallic region), respectively.

Figure 2A:
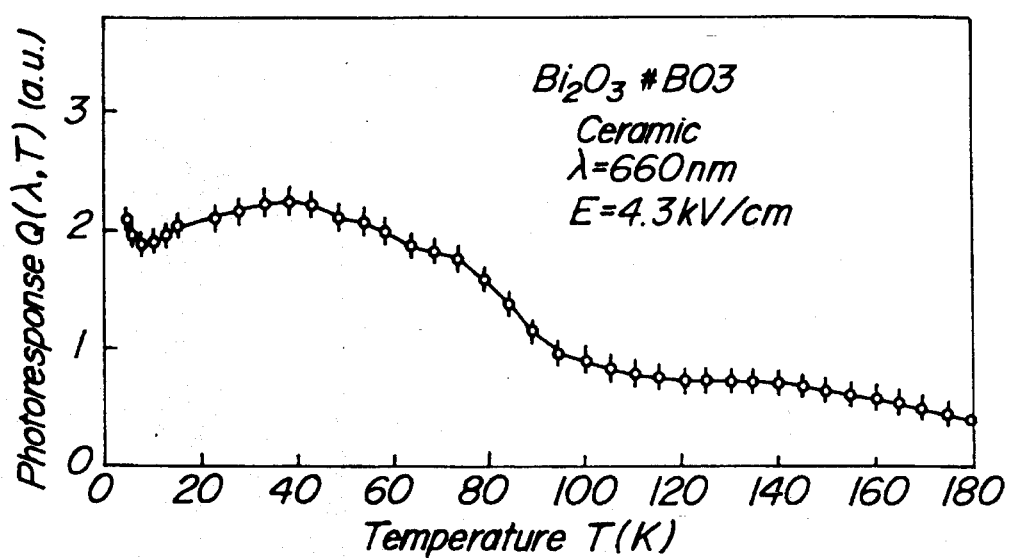

Throughout different views of the drawing in FIGS. 16–18, 1 is a substrate, 2 a gate region, 3 a source region, 4 a drain region, 5 an insulating layer, 6 a conductive glass layer, 7 an excitation light, 10 an alley-like light source, 11 an encoded image-mask pattern, 12 a correlative image screen, and 13 is a decoding mask optical element alley.

DESCRIPTION OF THE PREFERRED EMBODIMENTS

The present invention for a superconductive optoelectronic device uses a particular combination of the basic material $Bi_2O_3$ or $Bi_2O_3;M^{2+}$ (M=Sr,Ca,Cu), a host insulator, of superconductive-conjugate photoconductive character and the relevant Bi-based superconductive oxide materials as schematically enumerated in FIG. 1 into a form of a device in FIG. 16. There is a real peculiarity in such a combination.

In the inventor's opinion, all of these systems of high-$T_c$ superconductors have their origins in the basic substances. For example, the $Ba_1$—$Bi_1$—$O_z$ specimens can be synthesized by composing $BaCO_3$ powder with $Bi_2O_3$ powders at appropriate sintering temperatures. In the case of Bi—Ca—Cu—O specimen, one needs additional powder of $CaCO_3$. By systematically varying the Pb-composition of the $Ba_1Pb_{1-x}Bi_xO_z$, and the Sr-composition of the $Bi_1Sr_xCa_{2-x}Cu_2O_z$ systems, we have also examined and confirmed the existence of photoconductivity closely correlated with superconductivity complementary with each other at least at the conversion boundary, which we call "superconductive-conjugate photoconductivity". We have observed even a close correlation of superconductive-conjugate photoconductivity of the $Bi_1Sr_xCa_{2-x}Cu_2O_z$ system with those of $Bi_2O_3$ or $Bi_2O_3;M^{2+}$, the basic substance for all of the Bi-based superconductors as illustrated in FIGS. 2(a)–(d) and FIGS. 10(a)–(c) and FIG. 11, respectively. The step temperatures $T_{ps}$ after their onsets in photoconductivity $Q(T,\lambda)$ of the Ba—Pb—Bi—O system are plotted in FIG. 12a in accordances or correspondences with the critical temperatures $T_{sc}$ in the dark resistivity $\rho(T)$ as a function of Bi-composition x.

FIGS. 3 and 8 display the wavelength $\lambda$-dependence of photoconductivity Q(T) of $Bi_2O_3$ and $Bi_2O_3;M^{2+}$ in FIGS. 2(a) and (b) with the $Bi_1Sr_xCa_{2-x}Cu_2O_z$ (x=0) in FIG. 2(c). Origins of "the superconductive-conjugate photoconductivity" and of "real superconductivity" can be inherently of common characters over the whole region of x.

Thus, such a combination does have a profound significance as discussed later. Technically, $Bi_2O_3$ can be a flux for producing the Bi-based high-$T_c$ superconductors. This fact guarantees an appropriateness for materials of the Gate region of a device. Similar is true of $Cu_2O$ for the Cu-based high-$T_c$ superconductors.

Accordingly, we have reexamined yet unexplored natures of these basic substance such as $Bi_2O_3$ and $Bi_2O_3;M^{2+}$ for the superconductive optoelectronic device and discovered substantially new natures of these photoconductive materials conjugated with superconductivity. Here, we describe further details of these informations below.

The inventor's experiments and analyses on the photoconductivity of basic substances and superconductivity of various relevant superconductive materials showed that the basic substance and a certain portion of superconductive materials in their phase diagram reveal photoconductivity conjugate with superconductivity at temperature below their regions of transition temperatures of superconductivity. For instance, in the case of superconductive oxides of the Bi—Sr—Ca—Cu—O system, the inventors discovered that with decreasing Sr content they exhibit the special feature as if their superconductivity can be converted into photoconductivity at temperatures below their critical temperatures.

FIGS. 2 illustrate typical results of experiments on the photoconductivity of the basic substance of $Bi_2O_3$ and $Bi_2O_3;M^{2+}$ with the superconductivity of the $Bi_1$—$Sr_x$—$Ca_{2-x}$—$Cu_2$—$O_z$ system oxides. The curve (a) and (b) in FIG. 2 show the temperature dependences of photoconductivity of $Bi_2O_3$ and $Bi_2O_3;M^{2+}$ single crystal which are the basic substances clarified by the inventor. The curve (c) in FIG. 2 illustrates the temperature dependence of superconductive-conjugate photoresponse of $Bi_1$—$Sr_x$—$Ca_{2-x}$—$Cu_2$—$O_z$ (x=0) in the dark. The curve in FIG. 2(d) illustrates the temperature dependence of electrical resistance of $Bi_1$—$Sr_x$—$Ca_{2-x}$—$Cu_2$—$O_z$ (x=1) in the dark. After a number of experiments and analyses on $Bi_2O_3$, $Bi_2O_3;M^{2+}$ and also the Bi—Sr—Ca—Cu—O system oxides with a general chemical formula of $Bi_{n-y}$—$Sr_x$—$Ca_{m-x}$—$Cu_2$—$O_z$, the inventors found that $Bi_2O_3$ or $Bi_2O_3;M^{2+}$ exhibit the photoconductivity in correspondences with the superconductivity of the Ba—Pb—Bi—O and Bi—Sr—Ca—Cu—O systems. Under the conditions of $3 \leq n \leq 5$, $2 \leq m \leq 4$, $1 \leq y \leq 3$, $0 \leq x \leq 2$, $4 \leq z \leq 11$, if the content x of Sr is between 1 and 2, i.e., $1 \leq x \leq 2$, the Bi—Sr—Ca—Cu—O oxides reveals superconductivity, while if the content x of Sr is not more than 1, i.e., $0 \leq x \leq 1$, the oxides reveals photoconductivity.

More particularly, with n=3, m=2, y=2 under the above-mentioned conditions, the Bi—Sr—Ca—Cu—O system reveals superconductivity if, e.g., its content x of Sr is in the range of $0.7\sim1 \leq x \leq 2$, and if its content x of Sr is smaller than $0.7\sim1$ such superconductivity disappears and it reveals complementary photoconductivity (x=0) at temperature regions below their transition temperatures. Those materials whose superconductivity is converted into complementary photoconductivity and vice versa depending on the concentration of a part of their ingredient atoms at temperature regions below their transition temperatures will be referred to as "superconductive-conjugate photoconductive materials" and their property will be referred to as "superconductive-conjugate photoconductivity" or simply "superconductive photoconductivity" herein. These are the case even for $Bi_2O_3$ or $Bi_2O_3;M^{2+}$. Thus, one may call $Bi_2O_3$ or even $Bi_2O_3;M^{2+}$ the basic substances of superconductive-conjugate photoconductivity for the Bi-based superconductors.

Curves in FIGS. 3(a) to (c) display the wavelength dependence of photoresponse of the basic substances of the oxide specimen $Bi_2O_3$ ceramics at T≈77K, $Bi_2O_3;M^{2+}$ single crystal and $Bi_1$—$Sr_x$—$Ca_{2-x}$—$Cu_2$—$O_z$ (x=0) at 4.2K, respectively. The basic substance $Bi_2O_3$ ceramics, $Bi_2O_3;M^{2+}$ single crystal and the oxide $Bi_1$—$Sr_x$—$Ca_{2-x}$—$Cu_2$—$O_z$ (x=0) have more or less similar optical responses in wavelength dependences; more specifically, as the wavelength λ decreases from 650 nm, their photoresponse Q (T,λ) gradually increases, whereas their photoresponses remain substantially at low levels for wavelengths longer than 650–700 nm.

The inventors noted that if the basic materials $Bi_2O_3$ revealing photoconductivity at a temperature below its transition temperature of the Bi-based superconductors is combined with another material such as the Ba—Pb—Bi—O, Ba—K—Bi—O and Bi—Sr—Ca—Cu—O systems revealing superconductivity at a temperature below its transition temperature, then such a combination will provide a useful superconductive optoelectronic device which reveals both superconductive and photoconductive characteristics at a temperature below the transition temperature thereof.

More specifically, if an optoelectronic element of FET-like shape as illustrated in FIG. 16 is formed by making a gate region with the basic substance $Bi_2O_3$ or $Bi_2O_3;M^{2+}$ of superconductive-conjugate photoconductivity while making a source region and a drain region with a relevant Bi-based oxide superconductive material, an output current whose magnitude varies depending on the wavelength and intensity of light incident to the gate region can be produced so as to flow across the source and drain regions. If such an optoelectronic device is sustained at a temperature below the transition temperature of its superconductive material, it must work as a superconductive optoelectronic device which can be used in numerous ways; for instance, as a power-loss-free optical switching device with high-speed response, an optical detector, an optical signals amplifying device, or the like.

Under these circumstances, the inventor has developed an intensive study on the basic substance $Bi_2O_3$ and especially $Bi_2O_3;M^{2+}$.

1) Experimental Technique (1) Because the basic material such as $Bi_2O_3$ and $Bi_2O_3;M^{2+}$ are wide gap semiconductors ($E_G$>2.2 eV) as indicated in FIG. 4 with high intrinsic resistivity, one has to adopt the fast pulse technique with blocking electrodes as explained in FIGS. 5 and 6 for studying transport phenomena in high impedance materials at photoexcitation. Technique to measure the transient photoconductivity Q at low temperature is powerful to avoid serious difficulties due to the non-ohmic character of contact electrodes and the space charge effect. Pulsed electric field up to E=2.2 kV/cm with a duration of 12 msec at a repetition rate of 13 Hz was applied in parallel with the cleaved plane of specimens. A synchronized incident light in flux density of $10^9$–$10^{13}$ photon/pulse with duration of 5 nsec were used at selected wavelength λ from a pulsed dye laser with a resolution Δλ=1 nm. Spectral responses were studied by an appropriate normalization procedure for incident power from the laser and spectral sensitivity of the pyroelectric detector. Transverse magnetic field H up to 6 T was applied perpendicular to the cleaved plane of sample by using a superconducting magnet.

2) Sample and Crystal Structure

Sintered $Bi_2O_3$ is a ceramic insulator and exhibit yellow color. Bismuth oxide $Bi_2O_3$, with adequate amounts of the divalent elements such as Ca, Sr or Ba added, is a newly developed material with color of orange yellow and crystallizes in the rhombohedral layered structure similar to $Bi_2Te_3$ and $BiI_3$. We have synthesized for the first time single crystals of bismuth oxide $Bi_2O_3;M^{2+}$ with rhombohedral layered structure stabilized by means of addition of the divalent metals Sr, Ca and Cu.

Single crystals of $Bi_2O_3;M^{2+}$ were grown by slow cooling of the melt of mixture composed of $5Bi_2O_3$, $2SrCO_3$, $CaCO_3$ and 2CuO in an alumina crucible at 860° C. Ratio of these starting materials corresponds to $Bi_2O_3:Bi_2Sr_2Ca_1Cu_2O_8$= 4:1, where $Bi_2Sr_2Ca_1Cu_2O_8$ is a high-$T_c$ superconductor with layered perovskite-type structure. Products are stratified in yellow and black parts assisted by tendency of crystallization into layer structure of the superconductor Bi—Sr—Ca—Cu—O systems. Yellow parts obtained by cleavage were used as samples in experiments. Sizes of samples were typically 5 mm×5 mm×40 μm. They contain Bi, Sr, Ca and Cu, respectively, 76.5, 17.2, 5.5 and 0.7 mol %. This ratio is equal to that of $Bi_2O_3;M^{2+}$ in crystallizing into the rhombohedral structure. Specimens also contain Al, B and Fe, respectively, 1,350, 270 and 10 mol·ppm, as impurities.

Crystal structure of these materials were investigated by the method of X-ray diffraction using CuKα radiation. FIG. 7 exemplifies the X-ray diffraction patterns of (a) sintered $Bi_2O_3$ ceramics, (b) powdered $Bi_2O_3;M^{2+}$ and (c) single crystal of $Bi_2O_3;M^{2+}$. FIGS. 7(a), (b) and (c) indicate that these materials belong to (a) the monoclinic and (b) and (c) rhombohedral structure similar to $Bi_2Te_3$ and $BiI_3$ as exemplified in FIG. 7d. The layered structure of $Bi_2Te_3$ is of quintuple layers composed of the order Te—Bi—Te—Bi—Te weakly connected each other by the van der Waals force (FIG. 7(e)). Structure of $Bi_2O_3;M^{2+}$ may be similar to that with $M^{2+}$ ion partially substituted for $Bi^{3+}$ ion. The lattice constants of rhombohedral $Bi_2O_3;M^{2+}$ were determined to be a=9.75 Å and α=23.4° by the X-ray diffraction pattern. FIG. 7(c) clearly indicates that the specimen is a single crystal and the cleaved plane is [111] plane.

3) Results and Discussions

Figure 8A:
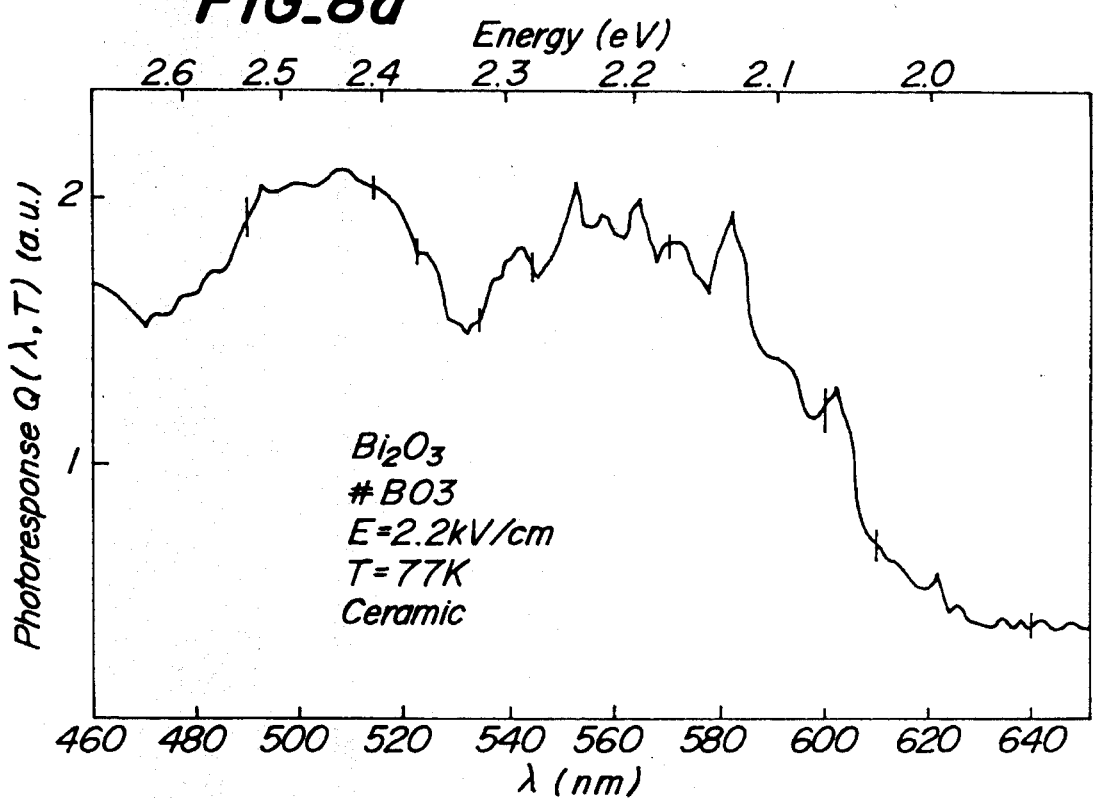
FIG. 8(a) and 8(b) display spectral responses of photoconductivity $Q(T,\lambda)$ of (a) sintered sample of pure $Bi_2O_3$ (#B03) at T=77K, E=2.2 kV/cm and (b) $Bi_2O_3;M^{2+}$(#S213 single crystal at T=77K, E=320 V/cm)
Figure 8B:
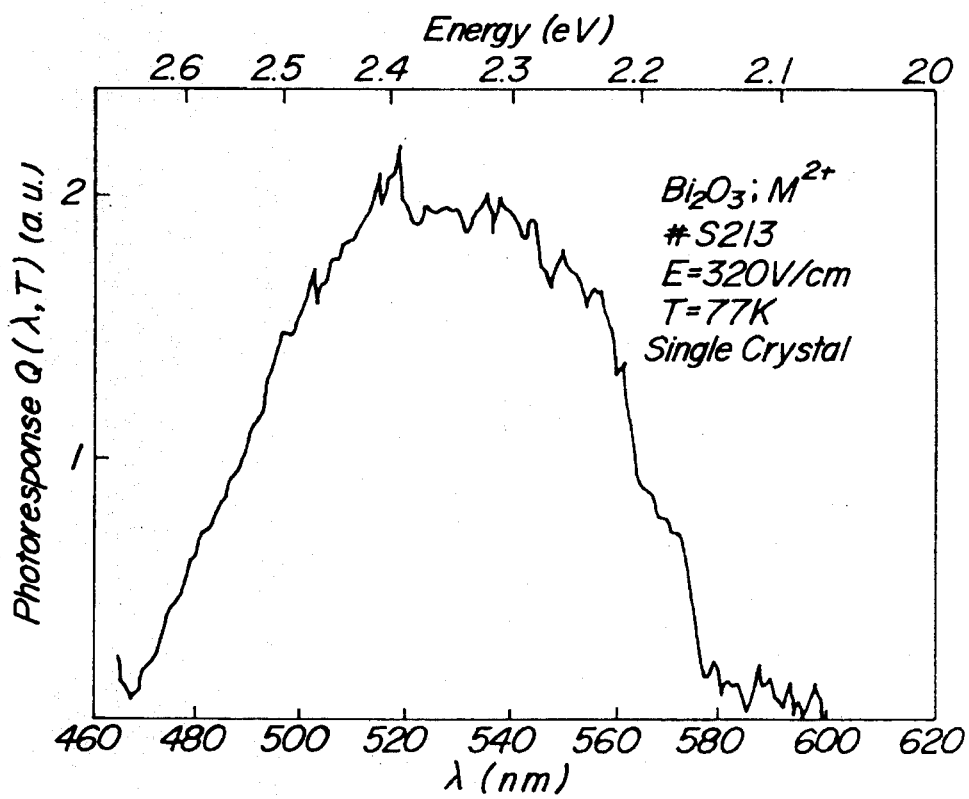

FIGS. 8(a) and (b) illustrate typical photoconductivity spectra of (a) sintered specimen of pure $Bi_2O_3$ at T=77K and (b) single crystal of $Bi_2O_3;M^{2+}$ at T=5.0K. In FIG. 8(b), spectral photoresponse of $Bi_2O_3;M^{2+}$ is observed in the relatively narrow region mainly between λ=470–570 nm. At T=77K, the spectra shift as a whole about 11 meV toward low energy side in comparison with that at T=5.0K in FIG. 3(b). The spectrum of $Bi_2O_3;M^{2+}$ at T=5.0K locates about 0.12 eV toward high energy side in comparison with that of pure sintered $Bi_2O_3$ in FIG. 8(a). Nevertheless, several fine structures in photoresponse spectra of $Bi_2O_3;M^{2+}$ in the region between λ=520–570 nm indicate clear correspondence with those of pure $Bi_2O_3$ in the region between λ=550–600 nm. This result indicates that these fine structures have no relevance with the divalent metals in $Bi_2O_3;M^{2+}$ and also details of the crystal structure. As the value of the absorption coefficient κ(λ) of $Bi_2O_3;M^{2+}$ around this range of wavelength is small (κ<$10^2$ cm$^{-1}$), we try to fit these fine structures to an exciton series tentatively due to the direct forbidden transition. For an exciton series, if we regard the peak at λ=568 nm (2.183 eV), the shoulder at λ=556 nm (2.230 eV) and the peak at λ=552 nm (2.246 eV) as those due to absorption of excitons of the main quantum number n=2, 3 and 4, respectively, we can obtain the energy spectrum of an exciton series $$E_n=2.267-0.336/n^2 (eV).$$

Further, for an another exciton series, if we also regard the peaks at λ=547 nm (2.267 eV) and λ=541 nm (2.291 eV) as those due to absorption of excitons of the main quantum number n=2, 3, respectively, we can obtain the energy spectrum $$E_n=2.313-0.186/n^2 (eV).$$

Thus, if we ascribe fine structures in the spectrum of photoconductivity to exciton series tentatively due to the direct forbidden transition, the values of Rydberg energy of excitons are estimated to be considerably large.

FIG. 9(a) illustrates typical traces of temperature dependence of photoconductivity of $Bi_2O_3;M^{2+}$. This exhibits an anomalous temperature dependence in contrast to normal photoconductivity which exponentially decreases with decreasing temperature. On the other hand, a comparison of the magneto-resistance with the Hall effect indicates that both electrons and holes contribute to the photoconductivity in the same degree. Thus, to obtain temperature dependence of mobility, we have estimated the magneto-resistance mobility defined by $\mu_M \equiv (c/H)\cdot(Q(O)/Q(H)-1)^{1/2}$ as a function of T as illustrated in FIG. 9(b). Below 20K, the observed mobilities are almost independent of temperature, indicating that the neutral impurity scattering is dominant. Above 30K, the observed mobilities decrease rapidly with increasing temperature, indicating predominance of the optical phonon scattering. We can analyze the temperature dependence of magneto-resistance mobility $\mu_M$ due to a combination of contribution of neutral impurity ($\mu_i$), optical phonon ($\mu_{LO}$) and acoustic phonon ($\mu_{ac}$) scatterings. As the contribution to the observed mobility of electrons can not be separated from that of positive holes, we have assumed that their effective mass and scattering time were of the same order of magnitude. The best fitting can be obtained by combining $$\mu_{LO}=70\times\{exp(245/T)-1\}[cm^2/V\cdot s],$$

$$\mu_{ac}=2\times 10^7 \times T^{-3/2}[cm^2/V\cdot s], \text{ and}$$

$$\mu_i=18,500 \ [cm^2/V\cdot s].$$

The result is illustrated in FIG. 9b with solid line.

Photoconductivity Q can be written in the form $Q=N\tau e\mu E=N_e\omega$, where N is the number of carriers released by a light pulse; τ, the average life time of a carrier; e, the electronic charge; μ, the drift mobility of carriers; E, the electric field; w, the "Schubweg" of carriers defined by w=μEτ. The magneto-resistance mobility $\mu_M$ is related to the drift mobility $\mu_d$ through a numerical factor of the order of unity, which is determined by the scattering mechanism of photocarriers. Anomalous temperature dependence of photoconductivity clearly indicates the prolongation of "Schubweg" of photocarriers with decreasing temperature. Such a temperature dependence of photoconductivity is a great contrast to that in ordinary insulators and semiconductors. In ordinary insulators and semiconductors, the life time of photocarriers decreases rapidly due to the trapping effect due to impurities and imperfections with decreasing temperature. The result of FIG. 9(a), however, indicates the anomalously sustained life time of photocarriers, as if the trapping effect becomes of little effect. Similar anomalous temperature dependence of photoconductivity also have been observed in the host insulators of high-$T_c$ superconductors of the Bi-based systems as the Ba—Pb—Bi—O in FIGS. 10–11. The situation may be quite similar.

Experimental results on the anomalously sustained temperature dependence of life time of photocarriers, as if the trapping effect becomes of little effect, suggest peculiar electronic state and relaxation process of photocarriers closely correlated with excitons with a large binding energy. In the systems with an extremely large binding energy of excitons, namely, a strong electron-hole interaction, there seems to be a possibility that a conduction electron or/and a hole forms a complex of elementary excitation "electronic polaron". The electronic polaron is an electron or a hole clothed with electronic polarization, namely, virtual exciton due to the strong electron correlation effect. Anomalously sustained temperature dependence of life time of photocarriers can be explained in terms of suppression of trapping of electrons via such virtual excitons. High-$T_c$ superconductivity may be profoundly associated with the condensation of the electronic polarons.

4) Further Remarks

Single crystal of bismuth oxide $Bi_2O_3;M^{2+}$ with rhombohedral layered structure has been synthesized for the first time by means of stabilization with addition of the divalent metals Sr, Ca and Cu. Novel temperature dependence of transient photoconductivity Q(T) exhibits anomalous enhancement with decreasing T. Temperature dependent magneto-resistance mobility $\mu_M(T)$ can be explained in terms of a combination of the effects of optical and acoustic phonon and neutral impurity scatterings. Residual value of $\mu_M(T)$ unexpectedly exceeds 20,000 $cm^2/V\cdot s$ at low temperature. Photoconductivity Q(T) clearly indicates anomalous sustained life time τ of photocarriers, as if the trapping effect becomes of little effect. These results suggest the peculiar relaxation process and electronic state of photocarriers due to the formation of exciton with large binding energy. Similar temperature dependences have been observed also in the host insulators of the Bi-based high-$T_c$ superconductors. These results also suggest the substantial role of so-called insulating parts or layers in high-$T_c$ superconductors in the mechanism of high-$T_c$ superconductivity.

Results on oxide materials of the Ba—Pb—Bi—O system will be described now by referring to FIG. 10 and FIG. 11. FIG. 10(a)–(c) show the temperature dependences of photoresponse Q(T,λ) of the basic substance $Bi_2O_3$ single crystal and oxide specimens with a general chemical formula of $Ba_1$—$Pb_{1-x}$—$Bi_x$—$O_z$, respectively.

FIG. 11(a) and (b) show the wavelength dependences of such photoresponse Q(T,λ) of the basic substance $Bi_2O_3$ ceramics and the above specimens $Ba_1$—$Pb_{1-x}$—$Bi_x$—$O_z$ (x=0.5), respectively. In the case of the oxides with a general chemical formula of $Ba_1$—$Pb_{1-x}$—$Bi_x$—$O_z$, the inventor found that they reveal superconductivity under the conditions of $0.20 \leq x \leq 0.35$ and $2.81 \leq z \leq 3$, while they reveal photoconductivity under the conditions of $1 \geq x \geq 0.35$ and $2.7 \leq z \leq 2.81$.

One can readily recognize that there exists a close correlation between Q(T,λ) of the basic substance $Bi_2O_3$ and the Ba—Pb—Bi—O (x≥0.35) and superconductivity of the Ba—Pb—Bi—O (0.2≤x≤0.35).

FIG. 12(a) indicates the phase diagram of the $Ba_1$—$Pb_{1-x}Bi_xO_z$ system in thermal equilibrium in the dark and also a quasi-phase diagram at photoexciton. Similar situations are displayed for the $Bi_2Sr_2Ca_{1-x}(Y_x)Cu_2O_z$ system in FIG. 12(b).

Detailed experimental data indicated in FIGS. 13–15 are of importance in the aspect for application of $Bi_2O_3$ in superconductive optoelectronic device described before. FIG. 13 shows the dependence of the photoconductivity of the basic substance $Bi_2O_3$ on the intensity of excitation light at a wavelength $\lambda=540$ nm. It may be concluded from FIG. 13 that photoresponse signals $Q(T,\lambda)$ of the basic substance $Bi_2O_3$ for the oxide material of Bi—Sr—Ca—Cu—O system increases with the intensity of the excitation light.

Dependences of relative magnitude of photoresponse $Q_x$ $(T,\lambda)/I_{ex}$ on the intensity of photoexcitation $I_{ex}$ have been studied for $Bi_2O_3;M^{2+}$ together with magneto-resistance mobility $\mu_M$ (a) in linear scale in FIG. 13(a) and (b) in logarithmic scale in FIG. 13(b). Resultant density of photocarriers n or $n/I_{ex}$ or variation $\Delta n$ are plotted in FIG. 14.

These data indicate that $Q(T,\lambda)$ is sublinearly dependent on $I_{ex}$ and the situations are similar but less steep at T=77K as indicated in FIGS. 15(a) and (b).

Thus, one must notice that the favorable condition is at 77K to the application of $Bi_2O_3;M^{2+}$ for superconductive optoelectronic devices.

[Examples]

FIGS. 16–18 is a schematic diagram showing the structure of an embodiment of the superconductive optoelectronic device with basic substance of superconductive-conjugate photoconductivity according to the invention. The embodiment is a superconductive phototransistor in which a positive gate voltage $V_G$ is used ($V_G \neq 0$). A substrate 1 is made of $SrTiO_3$, and a photoconductive gate region 2 is formed on the substrate 1 with superconductive-conjugate photoconductive-material $Bi_2O_3$ or $Bi_2O_3;M^{2+}$. The photoconductive gate region 2 has a width of 0.2 μm to 1.0 mm and a thickness of 1–10 μm. The basic substance $Bi_2O_3$ or $Bi_2O_3;M^{2+}$ of superconductive-conjugate photoconductivity reveals photoconductivity in response to excitation by incident light of wavelength at least $\lambda=460$–620 nm at a temperature below the transition temperature of a superconductive substance $Bi_1$—$Sr_1$—$Ca_1$—$Cu_2$—$O_z$. At opposite portions over the gate region 2, a source region 3 and a drain region 4 are formed with $Bi_1$—$Sr_1$—$Ca_1Cu_2$—Oz oxide which reveals superconductivity below its critical temperature of 80K or 105–115K. An electrically insulating layer 5 which is optically transparent is formed so as to cover top surfaces of the gate region 2, the source region 3, and the drain region 4. The insulating layer 5 of the illustrated example was a 1 μm thick $SiO_2$ film or mylar sheet. Further, a conductive surface of glass layer 6, for instance made of a NESA (Trademark of Pittsburgh Plate Glass Company) glass layer, is placed on the insulating layer 5, and electrodes are deposited on the conductive surface of glass layer 6.

A source for bias voltage VG is connected across the source region 3 and electrodes of the conductive surface of glass layer 6. A source for source-drain voltage VSD is connected between the source region 3 and the drain region 4 across the gate region 2.

In preparation of the source region 3 and the drain region 4, it is also possible even to form a comparatively broad region of $Bi_2O_3$ at first and then deposit the $Bi_1$—$Sr_x$—$Ca_{2-x}Cu_2$—$O_z$ (x=1) on $Bi_2O_3$ so as to produce the regions 3 and 4 in the broad region only at both sides.

In operation, the superconducting optoelectronic element of FIG. 16 is cooled to a temperature below the critical temperatures, i.e., about 80K or 105–115K, of the superconducting zones of $Bi_1$—$Sr_x$—$Ca_{2-x}$—$Cu_2$—$O_z$ and is photoexcited to the gate region 2. A pulsed dye laser of 3 nsec width can be used for an excitation light source. This fact basically indicates a high speed response of the device itself.

Thereby, photocarriers are created in the gate region 2 depending on the photon number or intensity of light incident thereto. The created carriers are accelerated by the source-drain voltage $V_{SD}$ so as to produce an induced output current which is delivered to an output resistor R. Accordingly, an output voltage due to incident photosignals appears across the resistor R.

The amount and density of optically excited carriers in the gate region 2 can be variable depending not only on the photon number of intensity of incident light thereto but also the bias voltage $V_G$, and the bias voltage $V_G$ can be harmoniously adjusted so as to meet specific requirements from users. By selecting an appreciate wavelength $\lambda$ for excitation light, photocarrier density of the order, e.g., of $10^{12}/cm^3$ can be obtainable in a surface layer of the gate region 2. With the above output current characteristics depending on the intensity of incident light, the superconducting optoelectronic device of FIG. 16 can be used as a superconductive switching device. The source region 3 and the drain region 4 made of superconductive material are free from heat generation during operation, so that the optoelectronic device of FIG. 16 possesses those advantages which are inherent to superconductivity.

FIG. 17 is a partial schematic diagram of an embodiment of the superconductive optoelectronic device of the invention, in which device a number of the superconductive optoelectronic devices of FIG. 16 are integrated at a high density in the form of one- or two-dimensional alleys. If wiring among different devices in the device of FIG. 17 is made by using superconducting material, heat generation in the alley or apparatus can be suppressed to an extremely low level. The superconducting optoelectronic device and apparatus of the invention can be used in various fields; for instance, as a loss-free pick up (or camera) devices, loss-free detectors of optical signals in an optical computer which executes parallel operations in a spatially arranged manner, and the like. The device of the invention can be also used in a multiple channel system which selectively utilizes a number of different wavelengths in the incident light.

FIG. 18 schematically illustrates an optical calculation procedure in a projection-correlative optical system of a space parallel optical computer in which system the superconductive optoelectronic devices of the invention are used. As an alley-like light source 10 projects a number of optical operation signals in parallel onto an encoded mask pattern 11. The mask pattern 11 carries encoded image signals in a mask fashion, which signals respond to the type of operation to be carried by the light beams.

FIG. 18A shows a method for encoding space signals by using a transparent portion T and a non transparent portion N. FIG. 18B shows that the image mask pattern 11 may be formed by combining a set of input patterns 11a and 11B encoded into a first and a second input patterns 11A', 11B' and bringing the two encoded patterns 11A', 11B', in tight contact with each other.

After passing through the mask pattern 11, the light beams pass a correlative image screen 12 and then enter in parallel into the corresponding devices in a decoding mask optical device alley 13. Each optical device receives a coded signal which is modulated by the screen mask, and operated results can be obtained from the optoelectronic output signals from each of the optical devices. If each optical device of the decoding mask optical device alley 13 is the superconductive optoelectronic device of the invention, parallel optical operations can be effected while minimizing heat generation during highly space-integrated operation.

Although the invention has been described so far by referring to an embodiment in the form of three-terminal device, the superconductive optoelectronic device of the invention can be also made in the form of a two-terminal device. More particularly, carriers created under the condition of $V_G=0$ in a broad gate region are influenced by the superconductive proximity effect due to superconductive-conjugate photoconductivity irrespective of a small coherence length, and one can expect that the superconductive optoelectronic device of the invention may be used as a superconductive Josephson junction device based on light irradiation. Thus, such two-terminal device may be treated as a "superconductive-conjugate photoconductivity or optically controlled Josephson junction device". In this case, the gate width and the intensity of the incident light must be properly selected.

The illustrated embodiment of the invention is made by using a combination of the basic substance $Bi_2O_3$ and the superconductive Bi—Sr—Ca—Cu—O system oxides, but other superconductive materials such as those of the Ba—Pb—Bi—O system, or Ba—K—Bi—O system can be also used to form the superconducting optoelectronic device and apparatus of the invention. Also, a superconducting optoelectronic device which is similar to the embodiment of FIGS. 16, 17 can be made by forming the gate region with the basic substance $Bi_2O_3;M^{2+}$ while forming the source region and the drain region with the superconductive Bi—Sr—Ca—Cu—O, Ba—K—Bi—O.

[Discussion]

The phenomena of superconductive-conjugate photoconductivity Q(T) are considered to be due to an unexpected prolongation of "Schubweg" w(T), the mobility $\mu_d(T)$ times the life time $\tau_t(T)$, of positive holes or/and conduction electrons. Prolongation of Schubweg here means mainly sustained $\tau_t(T)$, which must be due to a reduction of the transition probability of recombination processes H', either radiative or non-radiative. This fact strongly reveals an occurrence of the conversion of holes states to escape from individual trapping and eventually of an inherent condensation of positive holes into new states. Here, we discuss how such a condensation occurs at all in the followings.

Figure 19A:
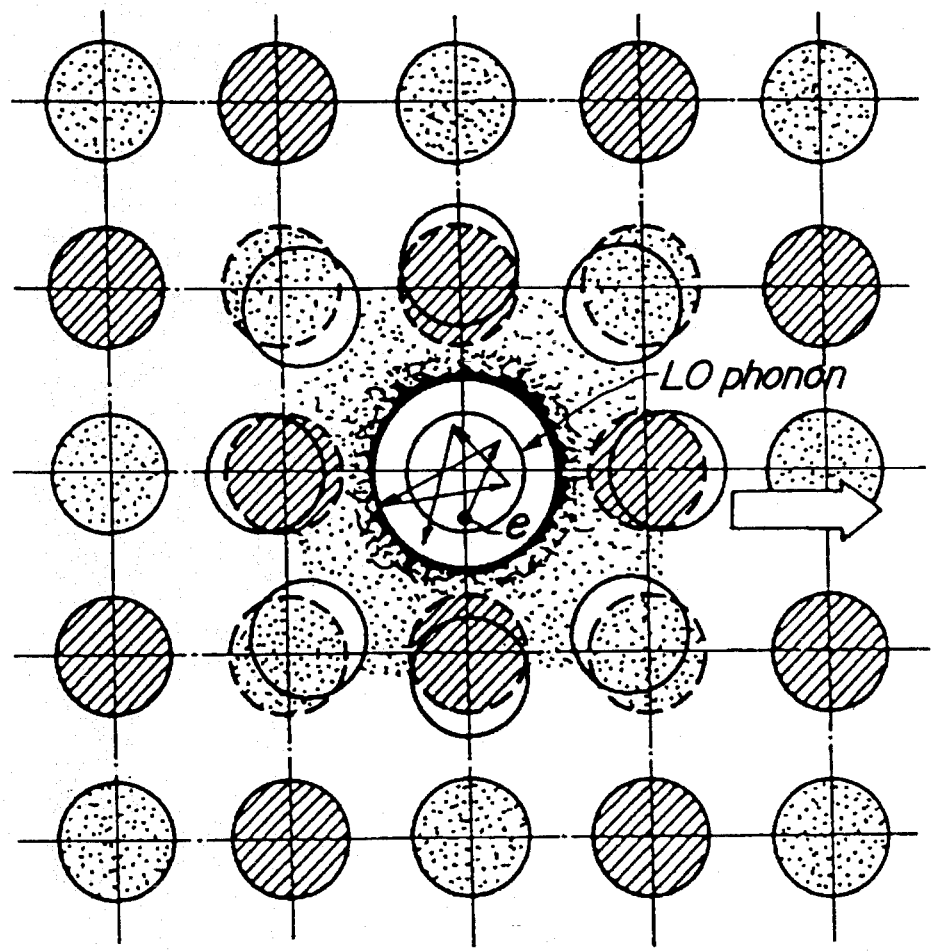
FIGS. 19(a) and (b) illustrate the concepts of (a) a "polaron", i.e., a conduction electron or a positive hole associated with LO-phonons or deformation of host crystal lattice together in free motion; (b) a "bipolaron" mediated via a coherent ensemble of phonons or lattice deformations or even electronic polarization.

The detailed mechanisms of the above photoconductive phenomena of the superconductive-conjugate photoconductive materials have not been fully clarified yet, but the inventor assumes it on the basis of the concepts of "polarons and excitons" as follows. A polaron is a freely moving conduction electron or a positive hole associated with LO-phonons or lattice deformations of even more generally with electronic polarization as schematically illustrated in FIG. 19(a). There is also even a concept of "bipolaron" due to coherent electron-phonon interaction or electron-electron correlation effects as illustrated in FIG. 19(b).

An exciton is an entity of elementary excitation as depicted in FIG. 20(a) which consists of a conduction electron and a positive hole bound together in an atomic hydrogen-like manner, sometimes, hybridized with (b) photons to compose a "polariton".

The spectral response or photoresponse signal Q(T,λ) of the curves (a), (b) and (c) of FIG. 3 implies that there exists the $Bi_2O_3$ like parts in the specimen of $Bi_1—Sr_x—Ca_{2-x}—Cu_2—O_z$ system oxide which are similar to $Bi_2O_3$ in an atomic sense, e.g., the $Bi_2O_3$ layer. The phenomena of optical absorption and photoconductivity of $Bi_2O_3$ have been clarified even only in part neither by experiments nor by the exciton theory except discussions described in pages 21–25. However, it is probably a typical example of Frenkel type exciton that is related to and associated with mobile charge near cation shell. The positions of the fine structures in the Q(2,λ) in FIG. 3 (c) basically coincide with those of the fundamental absorption edge in $Bi_2O_3$ itself. We can recognize a few prominent fine structures probably due to the excitons, e.g., structures around $\lambda \approx 560–580$ nm in the photoconductivity spectra of Bi—$Ca_2$—$Cu_2$—$O_3$ similar to those of $Bi_2O_3$ single crystal, structure of which appear to correspond to the n=2 state in a certain series of excitons of $Bi_2O_3$. Thus, we may reasonably conceive that there exists at least a finite fraction of the $Bi_2O_3$ like, part or phase which cannot be ignored in the Bi—Sr—Ca—Cu—O system substance, where the photoexcited electrons and holes are definitely mobile, irrespective of a certain difference of the crystal structures and the density of states. (See FIG. 21(a–c).

A conduction electron or a positive hole in standard types of $Bi_2O_3$ crystals has been reported to form a rather small polaron, respectively. However, an onset of "photoconductivity" Q(λ,T) even in the insulating specimens is clearly associated with an onset of "superconductivity" as if the superconductivity potentially underlies the photoconductivity phenomenon or vice versa. Thus, as to the effects of a polaron, whether it is a large polaron due to interaction with the LO-phonons, a small one due to the Jahn-Teller effect or possibly an intermediate one due to both effects, the effects of a polaron must be at least potentially important as indicated in FIGS. 2 and 3 and FIG. 8 through FIG. 15 as well as "the electronically polarized polaron effect". This is particularly important for $Cu_2O$ and $Bi_2O_3$. They are probably effective in a coherently hybridized form of elementary excitations. Here, we must pay special attention to the electronically polarized polarons, which one may call an "excitonic polaron". No one can fail to recognize close association among polarons and excitons with the experimental data here.

As shown in FIGS. 21–22, these polarons and excitons in the basic substance $Bi_2O_3$ had yielded out of the optical interband transition from the hybridized oxygen-(2p) and Bi-(6s) valence bands mainly to the Bi-(6p) conduction band together with the LO-phonon interaction, while leaving $O(2p)^6Bi(6s)^1$ "holes" (represented by a white circle) and creating a $Bi(6p)^1$ conduction electron. (Here, we explain the context in this scheme for $Bi_2O_3$, whereas there exists an alternative assignment for the energy band structures as remarked in FIGS. 4, 21a and 22a.) However, a polaron in $Bi_2O_3$ and the Bi—Sr—Ca—Cu—O system substance can be created either by the optical excitation or substitution of Ca with Sr perhaps via a chemical pressure. (See FIG. 21 (a) $Bi_2O_3$, (b) x=0 and (c) x=1). In the latter case, the substance becomes superconductive at x=1.) Since the positive holes in the hybrid Bi(6s) and O(2p) bands can be created from the many-body ground state by either an intra- or interband transition, the electron correlation effects naturally important. One must pay more attention to the dynamical valence fluctuation with $O(2p)^6$ between $Bi^{3+}$ and $Bi^{5+}$ and as well as between $Bi^{3+}$ and $Bi^{4+}$. Therefore, for the mechanism of high-temperature superconductivity, we may reasonably conceive potential roles of an ensemble of polarons, whether large or small, and especially closely associated excitons. The ensemble of united polarons and excitons here are probably a set of biplarons, polaronic excitons and/or, most probably, "exciton-mediated bipolarons" due to the dynamical electronphonon and electron correlation effects.

The photoresponse signals Q(T,λ) of Bi—Sr—Ca—Cu—O system substance as depicted by the curve (c) in FIG. 2 are very similar to those of $Bi_2O_3$ and $Bi_2O_3;M^{2+}$single crystal of the curve (b) in FIG. 2. Consequently, we believe that these studies of elementary excitations here must reveal the nature of superconducting ground state, irrespective of different crystal structure and an enormous difference in carrier density. In both, the excited state via elementary excitation (insulator) in FIG. 21 (c) and the ground state (superconductor) in FIG. 21 (d), one can expect occurrence of similar phenomena to those of the Josephson effect. Similar situations must be the cases also and for the basic substance $Bi_2O_3$ with Ba—Pb—Bi—O, Bi—Sr—Ca—Y—Cu—O systems but with other reasoning as suggested in FIG. 22 (c).

Figure 2B:
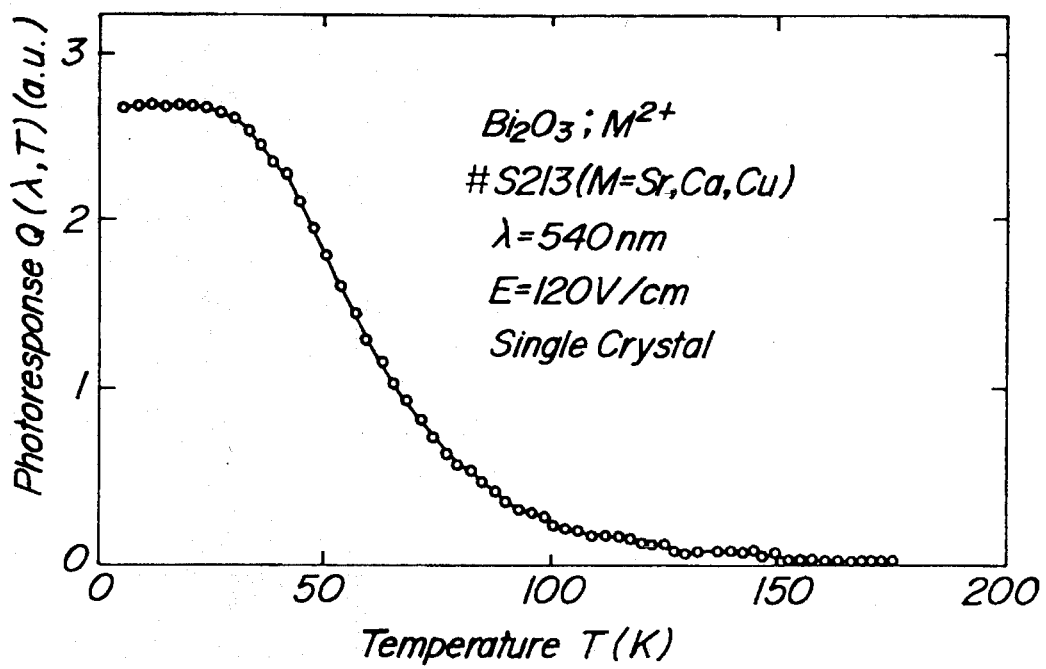

Novel temperature dependence of photoconductivity in FIG. 2b or 9a indicates anomalous sustaining of life time of photocarriers and suggests the peculiar relaxation process due to the exciton formation with large binding energy in $Bi_2O_3$. Similar temperature dependences have been observed in the host insulators of high-$T_c$ superconductors such as $Cu_2O$ and Y—Cu—O. These result for $Bi_2O_3$ also reveal the role of so-called insulating parts or layers in high-$T_c$ superconductors of Bi—Sr—Ca—Cu—O system in the mechanism of high-$T_c$ superconductivity as illustrated in FIGS. 2a and 2b.

To the best of our knowledge, this is the first clear experimental indication of the polaron and exciton mechanisms displayed in the high-temperature superconductivity of Ba—Pb—Bi—O, Bi—Sr—Ca—Cu—O, and Bi—Sr—Ca(Y)—Cu—O, system substances.

As described in detail in the foregoing, a superconductive optoelectronic device according to the invention comprises a source region, a drain region, the two regions being made of the Bi-based superconductive oxide material, and a gate region made of "the basic substance of $Bi_2O_3$ or $Bi_2O_3;M^{2+}$ of superconductive-conjugate photoconductivity" revealing photoconductivity at a temperature below the transition temperature of the above superconductive material. Thus, the invention provides an optoelectronic device with intrinsic "superconductive properties", i.e., extremely low generation rate of heat such as Joule heat during operation, and it facilitates development of various novel superconducting devices such as "an optically controllable superconductive Josephson junction devices", "superconductive phototransistors", and even opto-neural elements.

Further, a two-dimensional alley-like device with a high density integration of the superconductive optoelectronic devices of the invention has such electrodes and lead wire terminals which are of perfect diamagnetism, so that it is free from noises and interferences due to mutual electromagnetic induction between adjacent devices or due to outside magnetic fields. Therefore, the invention enables production of an ideal "superconductive optoelectronic device or apparatus" which operates under optimum thermal and electromagnetic conditions therein various forms of integration at ultrahigh density, such as a 'space parallel optical computer with a very high operating speed.

In short, the present invention is a successive pioneer in novel scientific field of "Superconductive Optoelectronics".

Although the invention has been described with a certain degree of particularity on the basic substance $Bi_2O_3$ and $Bi_2O_3;M^{2+}$, it must be understood that the present disclosure has been made only by way of example and that numerous variations in details may be resorted to without departing from the scope of the invention as hereinafter claimed.

What is claimed is:

1. A superconductive optoelectronic device, comprising a substrate, a photoconductive gate region formed on the substrate, and a source region and a drain region formed on the substrate at opposite sides of the gate region respectively so as to face toward each other across the gate region, and means for supplying bias voltage between said source region and drain region, said source and drain regions being made of a Bi-based superconductive oxide material, said gate region being made of
   (a) a basic substance $Bi_2O_3$ or
   (b) $Bi_2O_3$ having a rhombohedral layered structure formed and stabilized by adding therein at least one divalent element selected from the group consisting of Sr, Ca, and Cu which reveals photoconductivity at a temperature below critical temperature for superconductivity of said superconductive oxide material, whereby an electric current flowing between said source and drain regions is controlled in accordance with intensity of light which is made incident upon the gate region.

2. A superconductive optoelectronic device as set forth in claim 1, wherein the photoconductive gate region is made of
   (a) a basic substance $Bi_2O_3$ or
   (b) $Bi_2O_3$ having a rhombohedral layered structure formed and stabilized by adding therein at least one divalent element selected from the group consisting of Sr, Ca, and Cu and said source region and said drain region are made of a superconductive oxide material having a general chemical formula $Bi_{n-y}$—$Sr_x$—$Ca_{m-x}$—$Cu_y$—$O_z$ wherein $3 \leq n \leq 5$, $1 \leq y \leq 3$, $2 \leq m \leq 4$, $1 \leq x \leq 2$, $4 \leq z \leq 11$.

3. A superconductive optoelectronic device as set forth in claim 1, wherein the photoconductive gate region is made of a basic substance $Bi_2O_3$ having superconductive-conjugate photoconductivity and said source region and said drain region are made of a superconductive material having a general chemical formula $Ba_1$—$Pb_{1-x}$—$Bi_x$—$O_z$ wherein $0.2 \leq x \leq 0.35$, and $2.81 \leq z \leq 3$.

4. A superconductive optoelectronic apparatus comprising a plurality of superconductive optoelectronic devices as set forth in claim 2, wherein said devices are included in the apparatus in the form of an integrated array circuit at high density.

5. A superconductive optoelectronic apparatus comprising a plurality of superconductive optoelectronic devices as set forth in claim 3, wherein said devices are included in the apparatus in the form of an integrated array circuit at high density.

6. A superconductive optoelectronic apparatus comprising a plurality of superconductive optoelectronic devices as set forth in any one of claims 2 and 3, wherein said devices are included in the apparatus in the form of an integrated circuit.

7. The superconductive optoelectronic apparatus as set forth in claim 6, wherein said devices are included in the apparatus in the form of a two-dimensional array at ultrahigh density.

* * * * *